United States Patent
Rokubuichi et al.

(10) Patent No.: US 12,512,394 B2
(45) Date of Patent: Dec. 30, 2025

(54) SEMICONDUCTOR DEVICE AND POWER CONVERTER

(71) Applicant: Mitsubishi Electric Corporation, Tokyo (JP)

(72) Inventors: Hodaka Rokubuichi, Tokyo (JP); Kei Yamamoto, Tokyo (JP); Ken Sakamoto, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 680 days.

(21) Appl. No.: 17/795,536

(22) PCT Filed: Mar. 13, 2020

(86) PCT No.: PCT/JP2020/011192
§ 371 (c)(1),
(2) Date: Jul. 27, 2022

(87) PCT Pub. No.: WO2021/181678
PCT Pub. Date: Sep. 16, 2021

(65) Prior Publication Data
US 2023/0070214 A1    Mar. 9, 2023

(51) Int. Cl.
*H01L 23/495* (2006.01)
*H01L 23/00* (2006.01)
(Continued)

(52) U.S. Cl.
CPC .... *H01L 23/49541* (2013.01); *H01L 23/3107* (2013.01); *H01L 23/4334* (2013.01);
(Continued)

(58) Field of Classification Search
CPC ........... H01L 23/49541; H01L 23/3107; H01L 23/4334; H01L 23/49513; H01L 23/49562;
(Continued)

(56) References Cited

U.S. PATENT DOCUMENTS 5,586,389 A * 12/1996 Hirao ..................... H05K 1/144
29/841
5,646,827 A * 7/1997 Hirao ..................... H05K 5/064
361/752
(Continued)

FOREIGN PATENT DOCUMENTS

JP     06163778 A  *  6/1994
JP     6-196602 A      7/1994
(Continued)

OTHER PUBLICATIONS

International Search Report and Written Opinion mailed on Jul. 21, 2020, received for PCT Application PCT/JP2020/011192, filed on Mar. 13, 2020, 9 pages including English Translation.

*Primary Examiner* — Michelle Mandala
(74) *Attorney, Agent, or Firm* — XSENSUS LLP

(57) ABSTRACT

A semiconductor device includes: a semiconductor element, a first lead frame, a second lead frame, and a thermally conductive member; and a sealing member sealing them. The first lead frame includes: a first portion exposed from a first side surface of the sealing member; and a second portion located closer to a lower surface of the sealing member than the first portion in a second direction crossing the lower surface. The semiconductor device further includes an intermediate frame which is located between the second portion and the fifth portion at least in the second direction. A distance, in the first direction, between the second portion and the intermediate frame is shorter than a distance, in the second direction, between an upper surface of the first portion and the upper surface of the second portion.

20 Claims, 14 Drawing Sheets

(51) Int. Cl.
*H01L 23/31* (2006.01)
*H01L 23/433* (2006.01)

(52) U.S. Cl.
CPC .. *H01L 23/49513* (2013.01); *H01L 23/49562* (2013.01); *H01L 23/49568* (2013.01); *H01L 23/49575* (2013.01); *H01L 24/48* (2013.01); *H01L 2224/32245* (2013.01); *H01L 2224/48137* (2013.01); *H01L 2224/48245* (2013.01); *H01L 2224/48247* (2013.01); *H01L 2924/00012* (2013.01); *H01L 2924/00014* (2013.01); *H01L 2924/181* (2013.01)

(58) Field of Classification Search
CPC ......... H01L 23/49568; H01L 23/49575; H01L 24/48; H01L 2224/32245; H01L 2224/48137; H01L 2224/48245; H01L 2224/48247; H01L 2924/00012; H01L 2924/00014; H01L 2924/181; H01L 2224/49109; H01L 2224/73265; H01L 2924/1815

See application file for complete search history.

(56) References Cited

U.S. PATENT DOCUMENTS

| | | | | |
|---|---|---|---|---|
| 5,657,203 | A | * | 8/1997 | Hirao ................ H01L 23/49861 |
| | | | | 361/752 |
| 6,313,598 | B1 | | 11/2001 | Tamba et al. |
| 8,022,522 | B1 | * | 9/2011 | Liou .................... H01L 23/3107 |
| | | | | 257/676 |
| 10,714,418 | B2 | * | 7/2020 | Ko ..................... H01L 23/49513 |
| 11,011,443 | B2 | * | 5/2021 | Suwa ...................... H01L 23/29 |
| 11,145,629 | B2 | * | 10/2021 | Koyanagi ......... H01L 23/49548 |
| 11,837,532 | B2 | * | 12/2023 | Bin Hud ............. H01L 21/4842 |
| 2005/0054141 | A1 | * | 3/2005 | Kim .................... H01L 23/3107 |
| | | | | 257/E23.047 |
| 2010/0120207 | A1 | * | 5/2010 | Arakawa ................. H01L 24/48 |
| | | | | 257/E21.502 |
| 2014/0291828 | A1 | | 10/2014 | Yasunaga et al. |
| 2015/0115423 | A1 | * | 4/2015 | Yamashita ........ H01L 23/49534 |
| | | | | 257/675 |
| 2015/0155228 | A1 | | 6/2015 | Ikeda et al. |
| 2020/0203261 | A1 | * | 6/2020 | Saito ....................... H01L 24/33 |
| 2020/0203289 | A1 | * | 6/2020 | Ching, Jr. ......... H01L 23/49541 |

FOREIGN PATENT DOCUMENTS

| | | |
|---|---|---|
| JP | 10-93015 A | 4/1998 |
| JP | 2000-91499 A | 3/2000 |
| JP | 2013-98199 A | 5/2013 |
| JP | 2014-192292 A | 10/2014 |
| JP | 2015-106685 A | 6/2015 |

* cited by examiner

SEMICONDUCTOR DEVICE AND POWER CONVERTER

CROSS-REFERENCE TO RELATED APPLICATION

The present application is based on PCT filing PCT/JP2020/011192, filed Mar. 13, 2020, the entire contents of which are incorporated herein by reference.

TECHNICAL FIELD

The present disclosure relates to a semiconductor device and a power converter.

BACKGROUND ART

A transfer-molded-type semiconductor device (hereinafter referred to simply as semiconductor device) includes a first lead frame exposed from a first side of a sealing member, and a second lead frame exposed from a second side, opposite to the first side, of the sealing member, because this type of semiconductor device is manufactured by means of a mold that is movable up and down.

A general semiconductor device includes, in order to dissipate heat generated from a semiconductor element, a thermally conductive member that is thermally connected to the semiconductor element and partially exposed from the sealing member, and the thermally conductive member is thermally connected to a cooler made from metal. Therefore, for a semiconductor device required to have a high breakdown voltage, it is necessary to ensure an electrical insulation distance (i.e., clearance distance and creepage distance) between each of the first and second lead frames exposed from the sealing member and the thermally conductive member.

In the general semiconductor device, a part of the first lead frame is located between the semiconductor element and the thermally conductive member. Therefore, in such a semiconductor device, the first lead frame has been bent in order to ensure the electrical insulation distance. Specifically, between the portion of the first lead frame exposed from the sealing member and the portion of the first lead frame located between the semiconductor element and the thermally conductive member, an inclined portion that is inclined with respect to both of these portions is formed through a bending process. The length of the inclined portion is set depending on a required electrical insulation distance.

Japanese Patent Laying-Open No. H06-196602 (PTL 1) discloses a method of manufacturing a semiconductor device in which two lead terminals are stacked on each other with a semiconductor chip interposed in between.

CITATION LIST

Patent Literature

PTL 1: Japanese Patent Laying-Open No. H06-196602

SUMMARY OF INVENTION

Technical Problem

The first lead frame and the second lead frame of the semiconductor device are generally formed from a single sheet-like member. Specifically, the first lead frame and the second lead frame are initially formed as a single lead frame through a stamping process and a bending process performed on the sheet-like member. After this, a portion of the first lead frame and a portion of the second lead frame are sealed in a sealing member, and thereafter the other portion of each of these lead frames that is exposed from the sealing member is cut. In this way, the first lead frame and the second lead frame are formed as separate lead frames.

In this case, the distance between the first lead frame and the second lead frame is longer as the length of the inclined portion of the first lead frame is longer. Namely, for the conventional semiconductor device, it is difficult to further downsize the semiconductor device while ensuring the electrical insulation distance.

Even with the method of manufacturing a semiconductor device disclosed in PTL 1 that is tried to be applied to a package having a plurality of terminals, it is difficult to further downsize the semiconductor device having many terminals while ensuring the electrical insulation distance.

A principal object of the present invention is to provide a semiconductor device that can be downsized relative to the conventional semiconductor device while ensuring the electrical insulation distance, as well as a power converter including the semiconductor device.

Solution to Problem

A semiconductor device according to the present disclosure includes: a semiconductor element, a first lead frame, a second lead frame, and a thermally conductive member; and a sealing member sealing the semiconductor element, the first lead frame, the second lead frame, and the thermally conductive member. The sealing member has a first side surface and a second side surface opposite to each other in a first direction, and a lower surface extending in the first direction. The first lead frame includes: a first portion exposed from the first side surface; a second portion located closer to the lower surface than the first portion in a second direction crossing the lower surface; and a third portion electrically connecting the first portion and the second portion to each other and inclined with respect to each of the first portion and the second portion. The second lead frame includes a fourth portion exposed from the second side surface, and a fifth portion spaced from the second portion in the first direction and the second direction. The second portion, the third portion, and the fifth portion are sealed in the sealing member. The semiconductor element is mounted on an upper surface of the second portion. The thermally conductive member includes a portion located opposite to the semiconductor element with respect to the second portion, thermally connected to the second portion, and exposed from the lower surface. The semiconductor device further includes an intermediate frame which is located between the second portion and the fifth portion in at least the second direction, and on which an element forming apart of an interconnect circuit including the first lead frame and the second lead frame is mounted. A distance, in the first direction, between the second portion and the intermediate frame is shorter than a distance, in the second direction, between an upper surface of the first portion and the upper surface of the second portion.

Advantageous Effects of Invention

According to the present disclosure, a semiconductor device that can be downsized relative to the conventional semiconductor device while ensuring the electrical insula-

DESCRIPTION OF EMBODIMENTS

Figure 1:
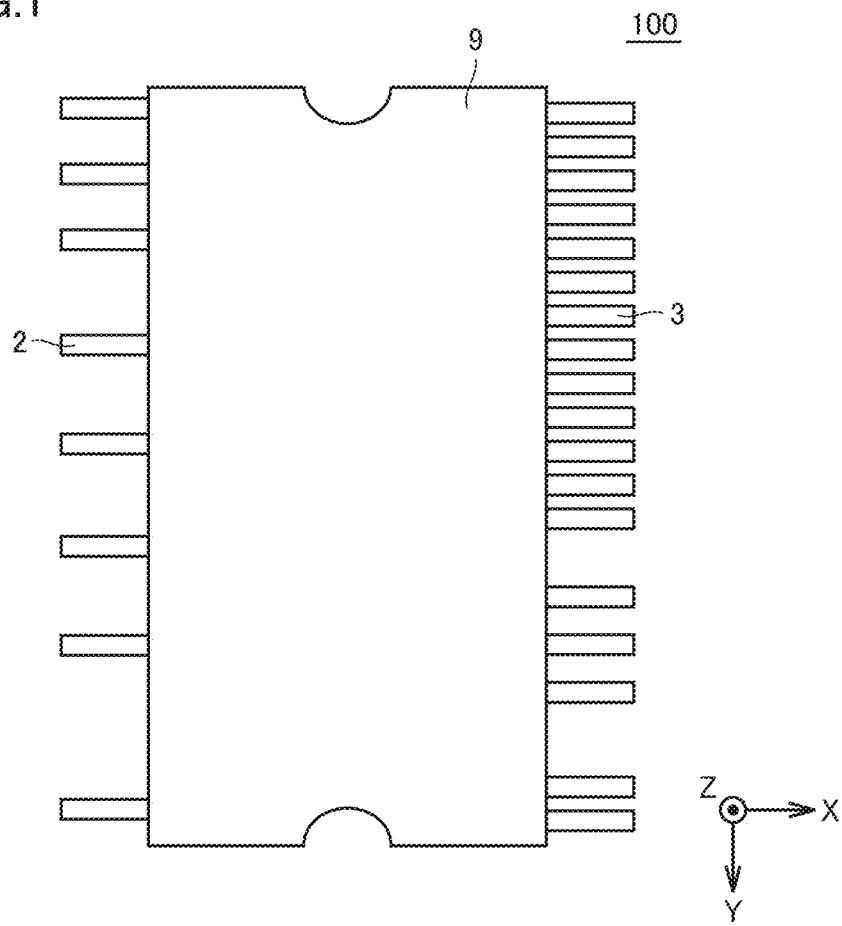
FIG. 1 is a plan view of a semiconductor device according to Embodiment 1.

Embodiments are described hereinafter with reference to the drawings. In the following description, a first direction X, a second direction Z, and a third direction Y that cross each other are used for the sake of convenience.

Embodiment 1

<Configuration of Semiconductor Device>

As shown in FIGS. 1 to 4, a semiconductor device 100 includes a semiconductor element 1, a first lead frame 2, a second lead frame 3, an intermediate frame 4, an electronic component 5, a first interconnect member 6, a second interconnect member 7, a thermally conductive member 8, and a sealing member 9.

As shown in FIGS. 1 to 4, sealing member 9 seals semiconductor element 1, first lead frame 2, second lead frame 3, intermediate frame 4, electronic component 5, first interconnect member 6, second interconnect member 7, and thermally conductive member 8. Semiconductor element 1, electronic component 5, first interconnect member 6, and second interconnect member 7 are entirely embedded in sealing member 9. First lead frame 2, second lead frame 3, intermediate frame 4, and thermally conductive member 8 each have a surface exposed from sealing member 9.

Each of first lead frame 2, second lead frame 3, intermediate frame 4, electronic component 5, first interconnect member 6, and second interconnect member 7 is an element forming a part of an interconnect circuit formed in semiconductor device 100.

When semiconductor device 100 is applied to a power converter 200 described later herein and semiconductor element 1 is a switching element of a main conversion circuit 201 of power converter 200 (see FIG. 25), first lead frame 2 forms a part of main conversion circuit 201, and second lead frame 3 and intermediate frame 4 form a part of a control circuit 203.

Sealing member 9 has a first side surface 9A, a second side surface 9B, a lower surface 9C, and an upper surface 9D. First side surface 9A and second side surface 9B are opposite to each other in first direction X. In second direction Z crossing first direction X, a central portion of each of first side surface 9A and second side surface 9B protrudes outward relative to the opposite ends of each of first side surface 9A and second side surface 9B, for example. Lower surface 9C and upper surface 9D are opposite to each other in second direction Z. Sealing member 9 is a composite material containing, as main components, resin and filling material such as filler, for example. The resin contained in sealing member 9 is either epoxy resin or phenol resin, for example.

Semiconductor element 1 is a vertical-type semiconductor element, for example, and includes an upper electrode and a lower electrode. The upper electrode is electrically connected to electronic component 5 through first interconnect member 6. The lower electrode is electrically connected to first lead frame 2 through a bonding member 10 having electrical conductivity. Semiconductor element 1 includes at least one selected from a diode used for a converter unit that converts input AC power to DC power, a bipolar transistor used for an inverter unit that converts DC power to AC power, an IGBT (Insulated Gate Bipolar Transistor), a MOSFET (Metal Oxide Semiconductor Field Effect Transistor), and a GTO (Gate Turn-Off Thyristor). Semiconductor element 1 is located on the lower surface 9C side relative to the center of semiconductor device 100 in second direction Z, for example. The material forming bonding member 10 includes solder or silver paste, for example.

Figure 2:
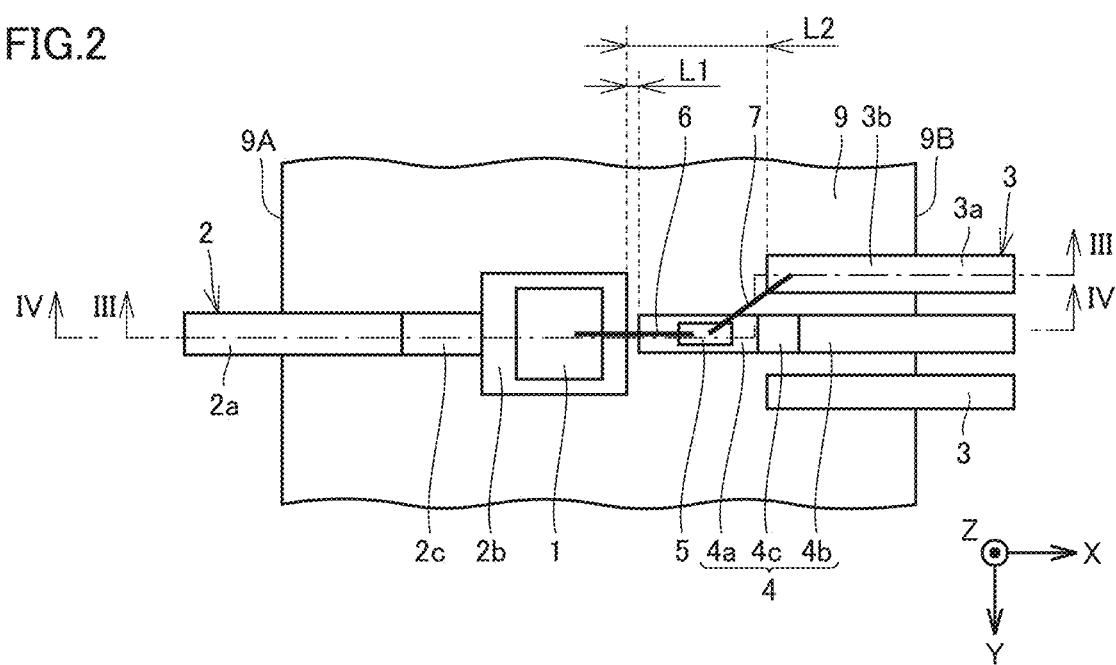
FIG. 2 is a plan view showing an inside of a sealing member of the semiconductor device shown in FIG. 1.
Figure 3:
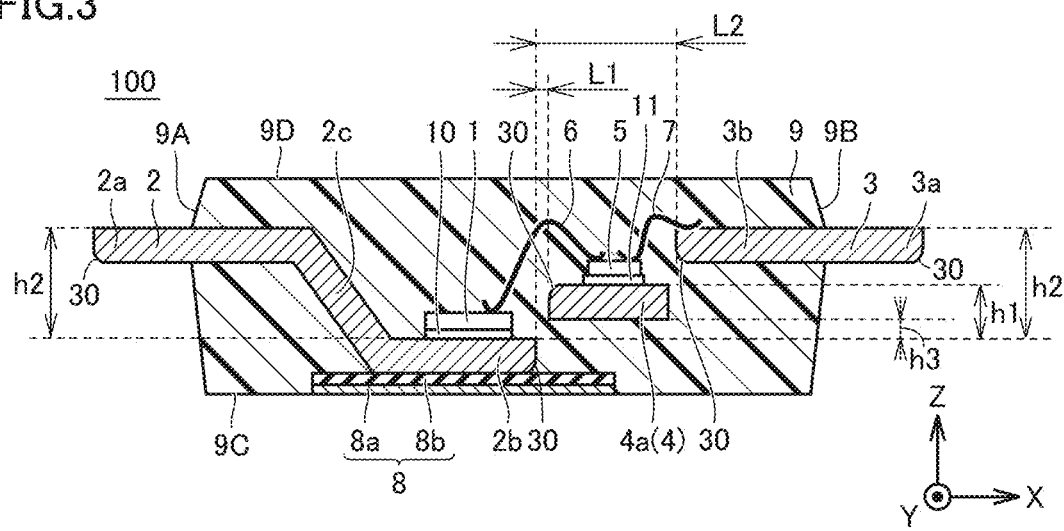
FIG. 3 is a cross-sectional view along a line III-III in FIG. 2.
Figure 4:
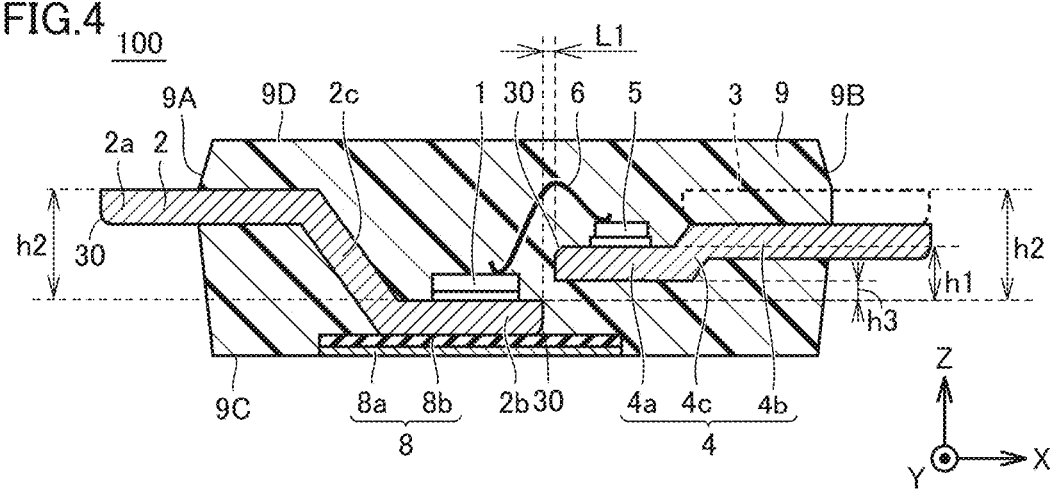
FIG. 4 is an end view along a line IV-IV in FIG. 2.

As shown in FIGS. 2 to 4, first lead frame 2 extends in first direction X. First lead frame 2 includes a first portion 2a exposed from sealing member 9, and a second portion 2b and a third portion 2c that are sealed in sealing member 9. First portion 2a, second portion 2b, and third portion 2c are provided as the same member.

As shown in FIGS. 2 to 4, the longitudinal direction of first portion 2a goes along first direction X. First portion 2a is exposed from first side surface 9A located higher than the center, in second direction Z, of sealing member 9. Second portion 2b is located closer to lower surface 9C than first portion 2a in second direction Z, and located closer to second lead frame 3 than first portion 2a in first direction X. Semiconductor element 1 is mounted on second portion 2b.

Second portion 2b has an upper surface electrically connected to the lower electrode of semiconductor element 1 through bonding member 10, and a lower surface thermally connected to an upper surface of thermally conductive member 8. The upper surface and the lower surface extend in first direction X and third direction Y and cross second direction Z. The upper surface of second portion 2b is located closer to lower surface 9C of sealing member 9 than the lower surface of first portion 2a in second direction Z. The width of second portion 2b in second direction Z is smaller than each of the width of second portion 2b in first direction X and the width of second portion 2b in third direction Y.

Third portion 2c electrically connects first portion 2a and second portion 2b to each other, and is inclined with respect to each of first portion 2a and second portion 2b. First portion 2a, third portion 2c, and second portion 2b are continuous in first direction X. One end, in first direction X, of first portion 2a is exposed from first side surface 9A of sealing member 9. The other end, in first direction X, of first portion 2a is connected to one end, in first direction X, of third portion 2c. The other end, in first direction X, of third portion 2c is connected to one end, in first direction X, of second portion 2b.

As shown in FIGS. 3 and 4, the internal angle formed by second portion 2b and third portion 2c on the XZ plane is an obtuse angle, for example. As shown in FIGS. 3 and 4, the internal angle formed by first portion 2a and third portion 2c on the XZ plane is an obtuse angle, for example.

As shown in FIGS. 2 to 4, second lead frame 3 extends in first direction X. Second lead frame 3 includes a fourth portion 3a exposed from sealing member 9, and a fifth portion 3b sealed in sealing member 9. Fourth portion 3a and fifth portion 3b are provided as the same member.

As shown in FIGS. 2 to 4, the longitudinal direction of fourth portion 3a goes along first direction X. Fifth portion 3b is located closer to first lead frame 2 than fourth portion 3a in first direction X. The longitudinal direction of fifth portion 3b goes along first direction X. Fourth portion 3a and fifth portion 3b are continuous in first direction X. The height of fourth portion 3a from lower surface 9C of sealing member 9 is identical to the height of first portion 2a from lower surface 9C of sealing member 9.

The end face of fifth portion 3b located on the first lead frame 2 side in first direction X is located closer to second side surface 9B than a connecting portion of a seventh portion 4a and a ninth portion 4c of intermediate frame 4, for example. The end face of fifth portion 3b located on the first lead frame 2 side in first direction X may be located closer to first lead frame 2 than the connecting portion of seventh portion 4a and ninth portion 4c of intermediate frame 4, for example.

As shown in FIGS. 2 to 4, intermediate frame 4 is sealed by sealing member 9. On intermediate frame 4, electronic component 5 is mounted as an element forming a part of the aforementioned interconnect circuit formed in semiconductor device 100. Electronic component 5 is an IC (integral Circuit) chip, for example. Electronic component 5 is fixed to intermediate frame 4 through bonding member 11. The material forming bonding member 11 includes solder or silver paste, for example.

Intermediate frame 4 is located between second portion 2b of first lead frame 2 and fifth portion 3b of second lead frame 3 in second direction Z. As shown in FIG. 4, intermediate frame 4 is entirely located below second lead frame 3 in second direction Z. Intermediate frame 4 is entirely located higher than second portion 2b of first lead frame 2 and lower than first portion 2a thereof in second direction Z.

As shown in FIGS. 2 to 4, intermediate frame 4 includes seventh portion 4a, an eighth portion 4b, and ninth portion 4c, for example. Seventh portion 4a, eighth portion 4b, and ninth portion 4c are provided as the same member. Seventh portion 4a, eighth portion 4b, and ninth portion 4c are continuous in first direction X.

Electronic component 5 is mounted on seventh portion 4a. Seventh portion 4a has an upper surface at least thermally connected to electronic component 5 through bonding member 11, and a lower surface spaced from lower surface 9C in second direction Z. The upper surface and the lower surface extend in first direction X and third direction Y and cross second direction Z. At least a part of the lower surface of seventh portion 4a faces thermally conductive member 8 with sealing member 9 interposed in between. Eighth portion 4b is located higher than seventh portion 4a in second direction Z. Ninth portion 4c electrically connects seventh portion 4a and eighth portion 4b to each other, and is inclined with respect to each of seventh portion 4a and eighth portion 4b. The end face of eighth portion 4b located opposite to ninth portion 4c in first direction X is exposed from second side surface 9B, for example. Eighth portion 4b of intermediate frame 4 extends outward relative to second side surface 9B, for example.

Seventh portion 4a, eighth portion 4b, and ninth portion 4c are entirely located higher than second portion 2b of first lead frame 2 and below first portion 2a thereof in second direction Z. Seventh portion 4a, eighth portion 4b, and ninth portion 4c are entirely located below second lead frame 3 in second direction Z. Of seventh portion 4a, eighth portion 4b, and ninth portion 4c, at least seventh portion 4a is partially located between second portion 2b and fifth portion 3b in first direction X.

The upper surface of seventh portion 4a of intermediate frame 4 is located higher than the upper surface of second portion 2b of first lead frame 2. The upper surface of seventh portion 4a of intermediate frame 4 is located lower than the lower surface of fourth portion 3a and fifth portion 3b of second lead frame 3. The lower surface of seventh portion 4a of intermediate frame 4 is located higher than the upper surface of second portion 2b of first lead frame 2, for example.

The end face of intermediate frame 4 located on the first lead frame 2 side in first direction X is located closer to second lead frame 3 than the end face of second portion 2b located on the second lead frame 3 side in first direction X. The distance between the end face of intermediate frame 4 located on the first lead frame 2 side in first direction X and the end face of second portion 2b located on the second lead frame 3 side in first direction X is L1.

Distance L1 in first direction X between second portion 2b and seventh portion 4a of intermediate frame 4 is shorter than a distance h2 in second direction Z between the upper surface of second portion 2b and the upper surface of first portion 2a. This distance L1 is shorter than the creepage distance of third portion 2c on the XZ plane. This distance L1 is shorter than a distance h1 between the upper surface of second portion 2b and the upper surface of seventh portion 4a in second direction Z. This distance L is shorter than a distance h3 between second portion 2b and seventh portion 4a in second direction Z. This distance L1 is shorter than a distance L2 between second portion 2b and second lead frame 3 in first direction X. This distance L2 is longer than aforementioned distance h2, for example. This distance h2 is 2 mm or more, for example. Preferably, this distance h2 is 3 mm or more.

The shortest distance between first lead frame 2 and intermediate frame 4 is shorter than the shortest distance between first lead frame 2 and second lead frame 3. The shortest distance between first lead frame 2 and intermediate frame 4 is the shortest distance between second portion 2b and seventh portion 4a. The shortest distance between first lead frame 2 and second lead frame 3 is the shortest distance between second portion 2b and fifth portion 3b.

First lead frame 2, second lead frame 3, and intermediate frame 4 are formed from a single sheet-like electrically conductive member. First lead frame 2 is formed through stamping and bending of the sheet-like electrically conductive member. Second lead frame 3 is formed through stamping of the electrically conductive member. Intermediate frame 4 is formed through stamping and bending of the electrically conductive member.

Each of first lead frame 2, second lead frame 3, and intermediate frame 4 has a droop surface 30 on its end face in the Z direction, due to stamping. Droop surface 30 formed on intermediate frame 4 faces opposite, in second direction Z, to droop surface 30 formed on each of first lead frame 2 and second lead frame 3. Droop surface 30 formed on intermediate frame 4 faces upward, for example. Droop surface 30 formed on each of first lead frame 2 and second lead frame 3 faces downward, for example. Droop surface 30 formed on intermediate frame 4 may face downward, while droop surface 30 formed on each of first lead frame 2 and second lead frame 3 may face upward.

The material forming first lead frame 2, second lead frame 3, and intermediate frame 4 may at least be any electrically conductive material, and includes copper (Cu) or aluminum (Al), for example.

The distance between lower surface 9C of sealing member 9 and first portion 2a of first lead frame 2 in second direction Z is identical to the distance between lower surface 9C of sealing member 9 and fourth portion 3a of second lead frame 3 in second direction Z, for example.

First interconnect member 6 electrically connects the upper electrode of semiconductor element 1 to electronic component 5. Second interconnect member 7 electrically connects electronic component 5 to fifth portion 3b of second lead frame 3. First interconnect member 6 and second interconnect member 7 include at least one of wire and ribbon, for example. In this case, first interconnect member 6 and second interconnect member 7 are connected to each member by using ultrasonic ball bonding, thermocompression bonding, or using both ultrasonic ball bonding and thermocompression bonding.

In second direction Z, the distance between the bonding portion of the upper electrode of semiconductor element 1 and first interconnect member 6, and the bonding portion of electronic component 5 and first interconnect member 6, is shorter than the distance between the bonding portion of the upper electrode of semiconductor element 1 and first interconnect member 6, and the bonding portion of second lead frame 3 and second interconnect member 7, for example.

In first direction X, the distance between the bonding portion of the upper electrode of semiconductor element 1 and first interconnect member 6 and the bonding portion of electronic component 5 and first interconnect member 6, is shorter than the distance between the bonding portion of the upper electrode of semiconductor element 1 and first interconnect member 6 and the bonding portion of second lead frame 3 and second interconnect member 7, for example.

Thermally conductive member 8 is a portion located in semiconductor device 100 and thermally connected to an external cooler. Thermally conductive member 8 electrically insulates semiconductor element 1 and first lead frame 2 from the cooler and also thermally connects them to each other. The upper surface of thermally conductive member 8 is thermally connected to the lower surface of second portion 2b of first lead frame 2. The lower surface of thermally conductive member 8 is exposed from lower surface 9C of sealing member 9.

Thermally conductive member 8 is a stack of an electrically conductive member 8a that is electrically conductive and thermally conductive, and an electrically insulating member 8b that is electrically insulating and highly thermally conductive, for example. Electrically conductive member 8a is a metal foil or metal sheet, for example. The material forming electrically conductive member 8a includes Cu or Al, for example. Electrically insulating member 8b is thermosetting resin in which filler having high thermal conductivity is mixed, for example. The material forming the filler includes at least any of silica ($SiO_2$), alumina ($Al_2O_3$), and boron nitride (BN), for example. The width (thickness) of electrically conductive member a in second direction Z is equal to the width (thickness) of electrically insulating member 8b in second direction Z, for example.

The thickness of electrically conductive member 8a of thermally conductive member 8 may be larger than the width (thickness) of electrically insulating member 8b in second direction Z, for example. Such thermally conductive member 8 has a high heat dissipation property as compared with thermally conductive member 8 in which the thickness of electrically conductive member 8a is substantially equal to the thickness of electrically insulating member 8b. Further, from a comparison between two semiconductor devices 100 that are substantially identical to each other in terms of the aforementioned distance h2, and different from each other only in the thickness of thermally conductive member 8, it is seen that the electrical insulation distance of semiconductor device 100 including thermally conductive member 8 having a relatively larger thickness is longer than the electrical insulation distance of semiconductor device 100 including thermally conductive member 8 having a relatively smaller thickness.

Semiconductor device 100 includes a plurality of semiconductor elements 1, a plurality of first lead frames 2, a plurality of second lead frames 3, a plurality of intermediate frames 4, a plurality of electronic components 5, a plurality of first interconnect members 6, and a plurality of second interconnect members 7, for example. In such semiconductor device 100, a plurality of sets of components, of which one set of components is shown in FIGS. 2 to 4, are arranged in third direction Y.

<Method of Manufacturing Semiconductor Device>

A method of manufacturing semiconductor device 100 includes: a first step of performing a stamping process, a first bending process, and a second bending process on electrically conductive member 20; a second step of mounting, after the first step, semiconductor element 1, electronic component 5, first interconnect member 6, and second interconnect member 7 on electrically conductive member 20; a third step of forming, after the second step, sealing member 9 that seals the whole of semiconductor element 1, electronic component 5, first interconnect member 6, and second interconnect member 7, and a part of electrically conductive member 20; and a fourth step of cutting, after the third step, a part of electrically conductive member 20 exposed from sealing member 9.

In the first step, electrically conductive member 20 in a flat sheet shape is prepared first. Next, a stamping process is performed on electrically conductive member 20. In the example shown in FIGS. 5 and 6, a punch is moved upward in second direction Z to punch electrically conductive member 20. In this way, electrically conductive member 20 shown in FIGS. 5 and 6 is formed.

Figure 5:
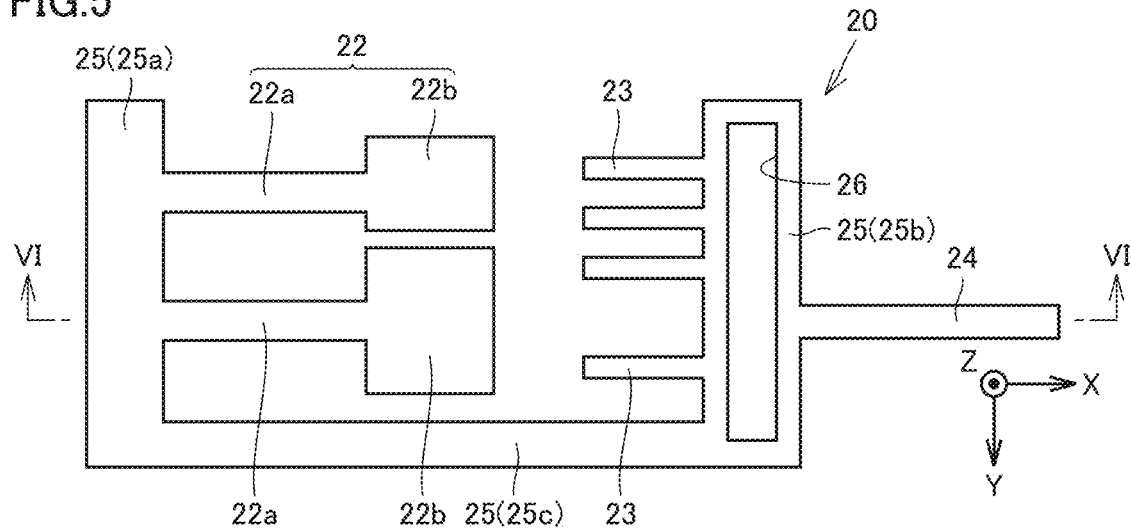
FIG. 5 is a partial plan view showing a step of a method of manufacturing the semiconductor device shown in FIGS. 2 to 5.
Figure 6:
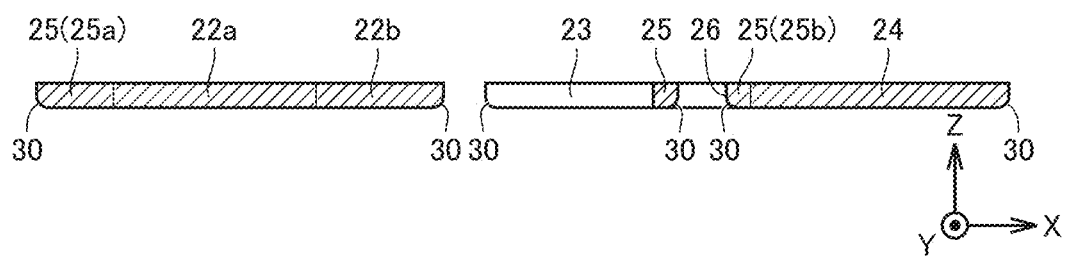
FIG. 6 is across sectional view along a line VI-VI in FIG. 5.

As shown in FIGS. 5 and 6, electrically conductive member 20 includes a first sheet portion 22, a second sheet portion 23, a third sheet portion 24, and a frame 25 connecting these portions. First sheet portion 22 is eventually processed into first lead frame 2. Second sheet portion 23 is eventually processed into second lead frame 3. Third sheet portion 24 is eventually processed into intermediate frame 4.

First sheet portion 22, second sheet portion 23, and third sheet portion 24 extend in first direction X. Frame 25 includes a first frame portion 25a connected to first sheet portion 22, a second frame portion 25b connected to second sheet portion 23 and third sheet portion 24, and a third frame portion 25c connecting first frame portion 25a and second frame portion 25b to each other. The longitudinal direction of each of first frame portion 25a and second frame portion 25b goes along first direction X. In second frame portion 25b, an opening 26 is formed, for example. Opening 26 is arranged side by side with second sheet portion 23 and third sheet portion 24 and spaced from these portions in first direction X.

One end, in first direction X, of first sheet portion 22 is connected to first frame portion 25a. The other end, in first direction X, of first sheet portion 22 is spaced in first direction X from one end, in first direction X, of second sheet portion 23.

Second sheet portion 23 is located, with respect to second frame portion 25b, to extend toward first sheet portion 22 in first direction X. The other end, in first direction X, of second sheet portion 23 is connected to a part of second frame portion 25b located on the first sheet portion 22 side with respect to opening 26. The distance, in first direction X, between first sheet portion 22 and second sheet portion 23 is less than the aforementioned distance L2.

Third sheet portion 24 is located, with respect to second frame portion 25b, to extend away from first sheet portion 22 in first direction X. One end, in first direction X, of third sheet portion 24 is connected to a part of second frame portion 25b located opposite to first sheet portion 22 with respect to opening 26. Second sheet portion 23 and third sheet portion 24 are arranged so as not to face each other, with second frame portion 25b located therebetween in first direction X.

As shown in FIG. 6, the stamping process causes a droop surface 30 to be formed at the lower end of the end face (cut surface) of electrically conductive member 20. Droop surface 30 is located between the lower surface of electrically conductive member 20 and a shear surface in the cut surface of electrically conductive member 20.

Next, the first bending process is performed on electrically conductive member 20 shown in FIGS. 5 and 6. In this way, electrically conductive member 20 shown in FIGS. 7 and 8 is formed.

Figure 7:
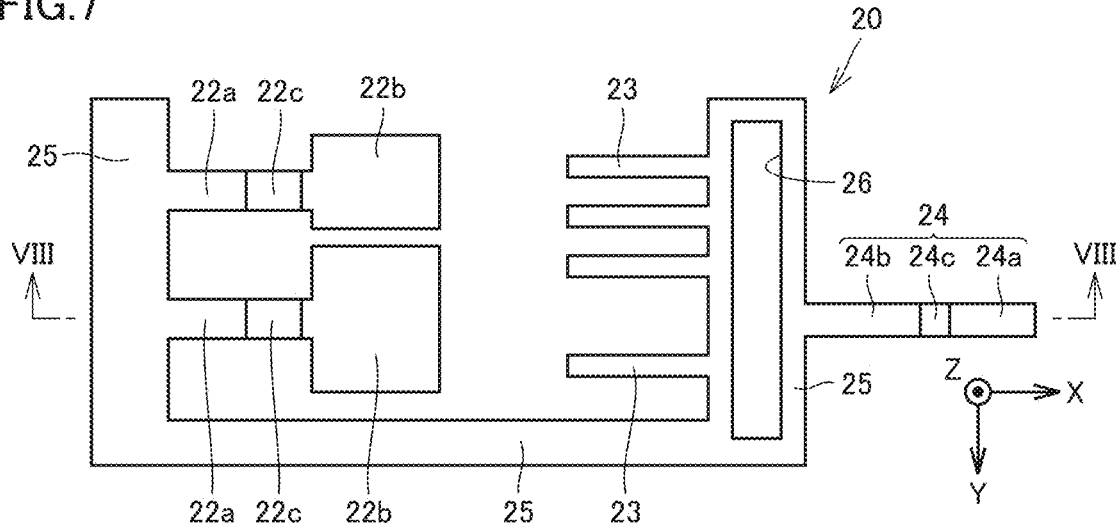
FIG. 7 is a partial plan view showing a step, after the step shown in FIG. 5, of the method of manufacturing the semiconductor device shown in FIGS. 2 to 5.
Figure 8:
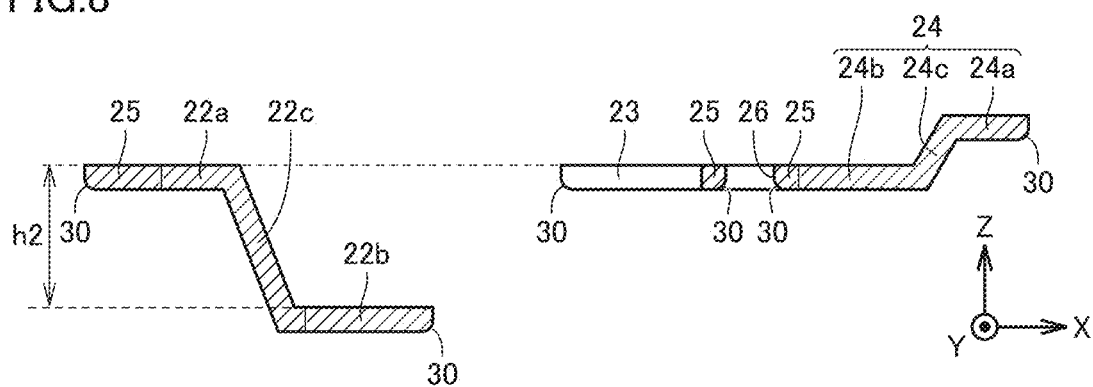
FIG. 8 is a cross-sectional view along a line VIII-VIII in FIG. 7.

As shown in FIGS. 7 and 8, first sheet portion 22 and third sheet portion 24 of electrically conductive member 20 are bent in opposite directions to each other. Accordingly, first portion 22a, second portion 22b, and third portion 22c are formed in first sheet portion 22. In third sheet portion 24, a seventh portion 24a, an eighth portion 24b, and a ninth portion 24c are formed.

One end, in first direction X, of first portion 22a is connected to first frame portion 25a. The other end, in first direction X, of first portion 22a is connected to one end, in first direction X, of third portion 22c. The other end, in first direction X, of third portion 22c is connected to one end, in first direction X, of second portion 22b. Second portion 22b is located lower than the lower surface of first portion 22a in second direction Z. The distance, in second direction Z, between the upper surface of first portion 22a and the upper surface of second portion 22b, and the distance, in second direction Z, between the upper surface of first portion 22a and the upper surface of second sheet portion 23 are the aforementioned distance h2. Third portion 22c connects first portion 22a and second portion 22b to each other and inclined with respect to each of first portion 22a and second portion 22b.

One end, in first direction X, of eighth portion 24b is connected to second frame portion 25b. The other end, in first direction X, of eighth portion 24b is connected to one end, in first direction X, of ninth portion 24c. The other end, in first direction X, of ninth portion 24c is connected to one end, in first direction X, of seventh portion 24a. Seventh portion 24a is located higher than the upper surface of eighth portion 24b in second direction Z. Ninth portion 24c connects seventh portion 24a and eighth portion 24b to each other and is inclined with respect to each of seventh portion 24a and eighth portion 24b.

Next, the second bending process is performed on electrically conductive member 20 shown in FIGS. 7 and 8. In this way, electrically conductive member 20 shown in FIGS. 9 and 10 is formed.

Figure 9:
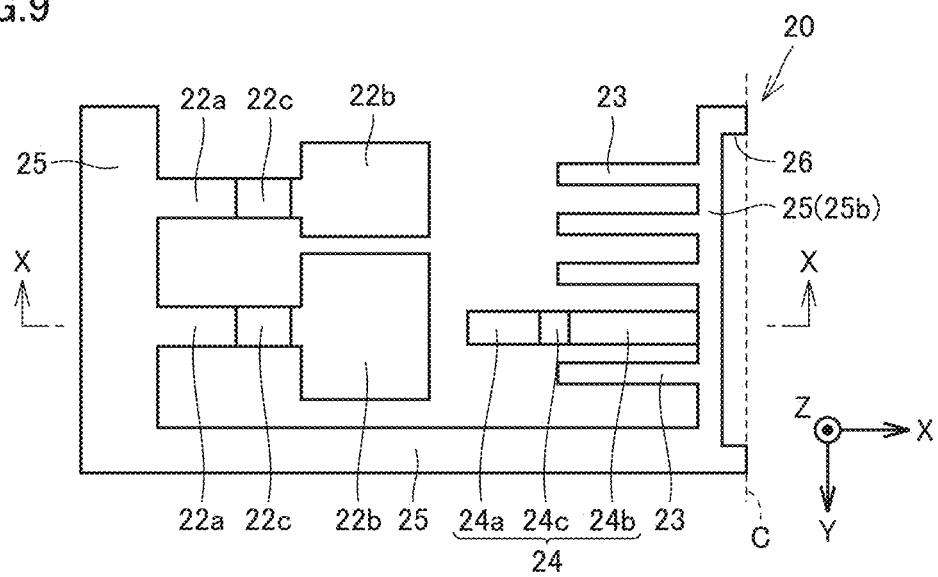
FIG. 9 is a partial plan view showing a step, after the step shown in FIG. 7, of the method of manufacturing the semiconductor device shown in FIGS. 2 to 5.
Figure 10:
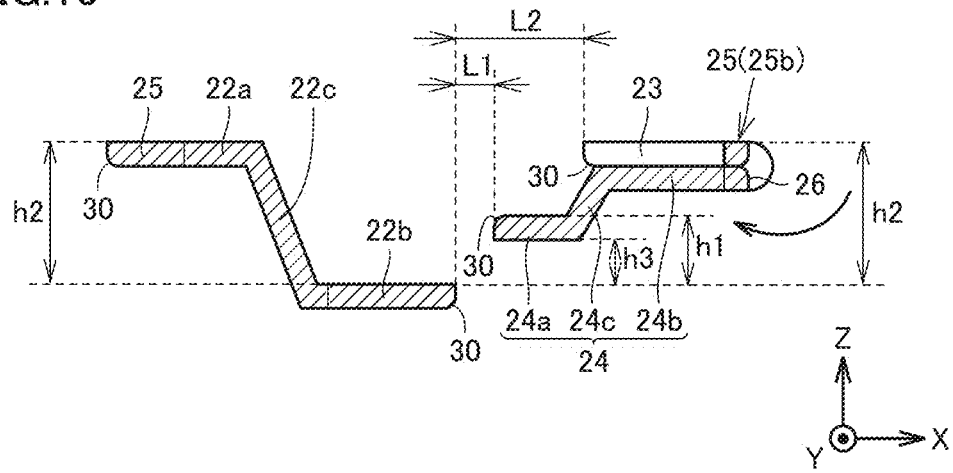
FIG. 10 is a cross-sectional view along a line X-X in FIG. 9.

As shown in FIGS. 9 and 10, third sheet portion 24 of electrically conductive member 20 is folded along a folding line C defined as a centerline. Folding line C is a virtual line passing through the center, in first direction X, of second frame portion 25b and opening 26, and extending in third direction Y. Accordingly, third sheet portion 24 is located lower than first sheet portion 22 and second sheet portion 23 in second direction Z. As shown in FIG. 10, droop surface 30 of third sheet portion 24 faces opposite to droop surface 30 of each of first sheet portion 22 and second sheet portion 23 in second direction Z. Droop surface 30 of third sheet portion 24 faces upward, and droop surface 30 of each of first sheet portion 22 and second sheet portion 23 faces downward.

The distance, in first direction X, between second portion 22b and seventh portion 24a is the aforementioned distance L1. The distance, in second direction Z, between the upper surface of second portion 22b and the upper surface of seventh portion 24a is the aforementioned distance h1. The distance, in second direction Z, between the upper surface of first portion 22a and the upper surface of second portion 22b is the aforementioned distance h2. The distance, in second direction Z, between the upper surface of second portion 22b and the lower surface of seventh portion 24a is the aforementioned distance h3. The distance, in first direction X, between second portion 22b and second sheet portion 23 is the aforementioned distance L2. Distance h2 is 3 mm, for example. The distance, in second direction Z, between the upper surface of seventh portion 24a and eighth portion 24b is 1.5 mm, for example.

In the second step, initially semiconductor element 1 and electronic component 5 are bonded through bonding members 10 and 11 to electrically conductive member 20 formed in the first step and shown in FIGS. 9 and 10. Semiconductor element 1 is bonded through bonding member 10 to the upper surface of second portion 22b of first sheet portion 22. Electronic component 5 is bonded through bonding member 11 to the upper surface of seventh portion 24a of third sheet portion 24. Next, first interconnect member 6 and second interconnect member 7 are formed. First interconnect member 6 electrically connects the upper electrode of semiconductor element 1 to electronic component 5. Second interconnect member 7 electrically connects electronic component 5 to second sheet portion 23. In this way, in the second step, an integrated unit including semiconductor element 1, electronic component 5, first interconnect member 6, second interconnect member 7, and electrically conductive member 20 shown in FIGS. 9 and 10 is formed.

In the third step, sealing member 9 is molded by means of transfer molding, compression molding, or injection molding, or the like. Initially, the integrated unit formed in the second step and including semiconductor element 1, electronic component 5, first interconnect member 6, second interconnect member 7, and electrically conductive member 20, as well as thermally conductive member 8 are placed in a mold. At this time, a part of first portion 22a of electrically conductive member 20 that is located on the first frame portion 25a side, first frame portion 25a, a part of second sheet portion 23 that is located on the second frame portion 25b side, a part of third sheet portion 24 located on the second frame portion 25b side, second frame portion 25b, and third frame portion 25c are arranged outside the mold. Next, a sealing material having flowability is injected into the mold and hardened. In this way, sealing member 9 is molded into the shape shown in FIGS. 1 to 4. A part of first portion 22a of electrically conductive member 20 located on the first frame portion 25a side, first frame portion 25a, a part of second sheet portion 23 located on the second frame portion 25b side, a part of third sheet portion 24 located on the second frame portion 25b side, second frame portion 25b, and third frame portion 25c are exposed outward from first side surface 9A and second side surface 9B of sealing member 9. The lower surface of thermally conductive member 8 is exposed outward from lower surface 9C of sealing member 9.

In the fourth step, at least first frame portion 25a, second frame portion 25b, and third frame portion 25c are removed. Accordingly, first lead frame 2 is formed from first sheet portion 22, second lead frame 3 is formed from second sheet portion 23, and intermediate frame 4 is formed from third sheet portion 24. A part of first sheet portion 22, second sheet portion 23, and third sheet portion 24 that is exposed from second side surface 9B may be removed. In this way, semiconductor device 100 is manufactured.

<Functions and Advantageous Effects>

Figure 32:
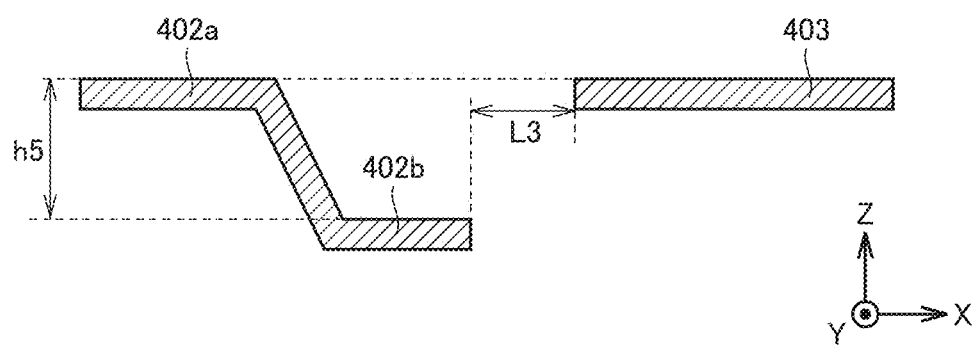
FIG. 32 is a cross-sectional view showing a first lead frame and a second lead fame formed by a conventional method of manufacturing a semiconductor device.
Figure 33:
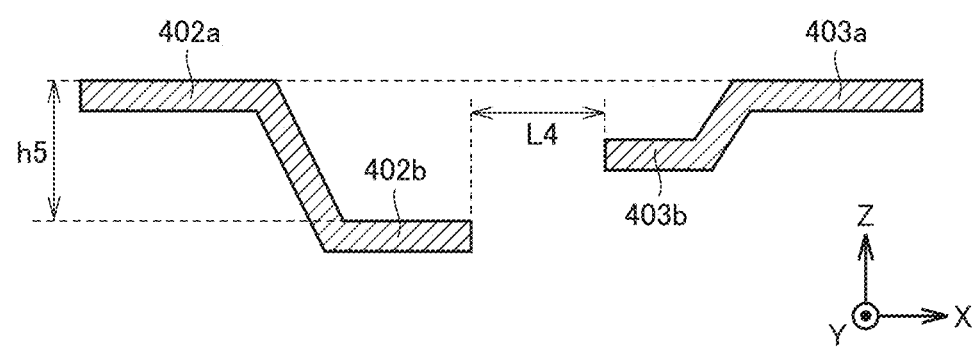
FIG. 33 is a cross-sectional view showing a first lead frame and a second lead frame formed by a conventional method of manufacturing a semiconductor device.

Functions and advantageous effects of semiconductor device 100 are now described based on a comparison between semiconductor device 100 and a comparative example shown in FIGS. 32 and 33.

As shown in FIGS. 32 and 33, in a semiconductor device according to the comparative example, a first lead frame 402 is bent in order to ensure the electrical insulation distance. First lead frame 402 includes a first portion 402a to be located outside the sealing member, and a second portion 402b on which a semiconductor element is to be mounted. Preferably, first lead frame 402 and second lead frame 403 are formed from one electrically conductive member in consideration of the manufacturing cost.

As shown in FIG. 32, when first lead frame 402 and second lead frame 403 are formed through a stamping process for one electrically conductive member and only first lead frame 402 undergoes a bending process, shortest distance L3 between first lead frame 402 and second lead frame 403 located closest to first lead frame 402 in first direction X is more than or equal to distance h5 between first portion 402a and second portion 402b of first lead frame 402. This is caused by the so-called shrinkage of pattern resulting from the bending process. Particularly as shown in FIG. 33, when first lead frame 402 and second lead frame 403 are formed from one electrically conductive member through the stamping process and the bending process, shortest distance L4 between first lead frame 402 and second lead frame 403 located closest to first lead frame 402 in first direction X is longer than the aforementioned distances L3, h5. This distance h5 is set based on the required electrical insulation distance. Therefore, for the semiconductor device provided as a comparative example, it is difficult to make distances L3 and L4 shorter than distance h5, in order to ensure the electrical insulation distance.

In contrast, semiconductor device 100 includes intermediate frame 4 which is located between the second portion of first lead frame 2 and fifth portion 3b of second lead frame 3 in second direction Z, and on which an element forming a part of the interconnect circuit including first lead frame 2 and second lead frame 3 is mounted. Distance L1, in first direction X, between second portion 2b and seventh portion 4a of intermediate frame 4 is shorter than distance h2, in second direction Z, between the upper surface of first portion 2a and the upper surface of second portion 2b.

Specifically, if this distance h2 is equal to the aforementioned distance h5 of the comparative example, the aforementioned distance L1 can be made shorter than distance L3 of the comparative example. Further, electronic component 5 to be mounted on the second lead frame in the comparative example is mounted on intermediate frame 4 in semiconductor device 100. Accordingly, second lead frame 3 can be made smaller in size than the second lead frame of the comparative example, by the region for mounting electronic component 5. Consequently, semiconductor device 100 can be downsized relative to the above comparative example, when at least the electrical insulation distance substantially equal to that of the comparative example is ensured.

Further, as shown in FIGS. 3 and 4, each of first lead frame 2, second lead frame 3, and intermediate frame 4 of semiconductor device 100 has droop surface 30 formed through the stamping process. The droop surface formed on the intermediate frame faces opposite, in the second direction, to droop surface 30 formed on each of the first lead frame and the second lead frame. Such first lead frame 2, second lead frame 3, and intermediate frame 4 can be formed from one electrically conductive member 20. First lead frame 2 can be formed from first sheet portion 22 undergoing the stamping process and the first bending process. Intermediate frame 4 can be formed from third sheet portion 24 undergoing the stamping process, the first bending process, and the second bending process. Third sheet portion 24 of electrically conductive member 20 is formed to extend away from first sheet portion 22 with respect to folding line C, and thereafter folded along folding line C defined as a centerline. Therefore, the aforementioned distance L1 is not influenced by the so-called shrinkage of pattern caused between first sheet portion 22 and second sheet portion 23 during the first bending process. Accordingly, for semiconductor device 100, the electrical insulation distance can be ensured and the downsizing relative to the comparative example can be achieved, while the manufacturing cost is reduced.

In semiconductor device 100, distance h2, in second direction Z, between the upper surface of first portion 2a and the upper surface of second portion 2b may be 2 mm or more.

As shown in FIGS. 3 and 4, in semiconductor device 100, first portion 2a is exposed from first side surface 9A located higher than the center, in second direction Z, of sealing member 9. In this way, the electrical insulation distance between first portion 2a exposed from sealing member 9 and thermally conductive member 8 is made relatively long. In semiconductor device 100, the upper limit of distance h2 is not limited by distance L1, and therefore, the electrical insulation distance can be made relatively long while achieving downsizing in first direction X.

Like first lead frame 2, second lead frame 3 of semiconductor device 100 may also have a folded shape. Fifth portion 3b of second lead frame 3 may be located closer to lower surface 9C than fourth portion 3a in second direction Z. The upper surface of fifth portion 3b is coplanar with the upper surface of seventh portion 4a of intermediate frame 4 or located higher than the upper surface thereof. Second lead frame 3 may further include a sixth portion for electrically connecting fourth portion 3a and fifth portion 3b to each other. The sixth portion electrically connects first portion 2a and second portion 2b to each other and is inclined with respect to each of first portion 2a and second portion 2b.

Embodiment 2

<Configuration of Semiconductor Device>

Figure 11:
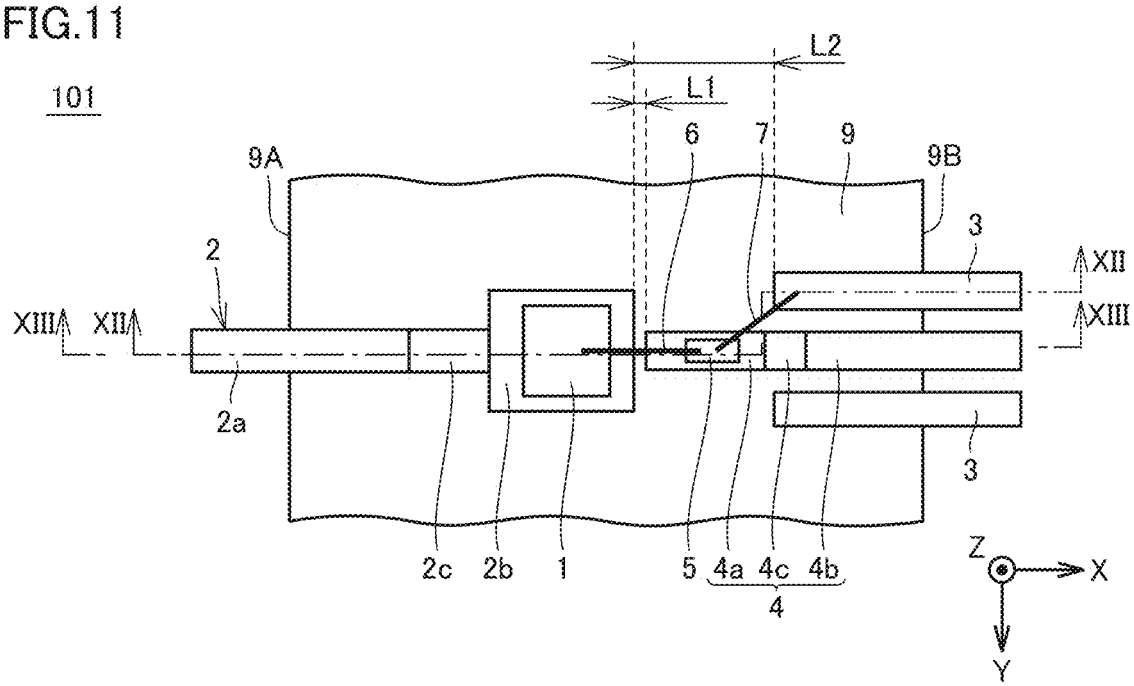
FIG. 11 is a partial plan view showing an inside of a sealing member of a semiconductor device according to Embodiment 2.
Figure 12:
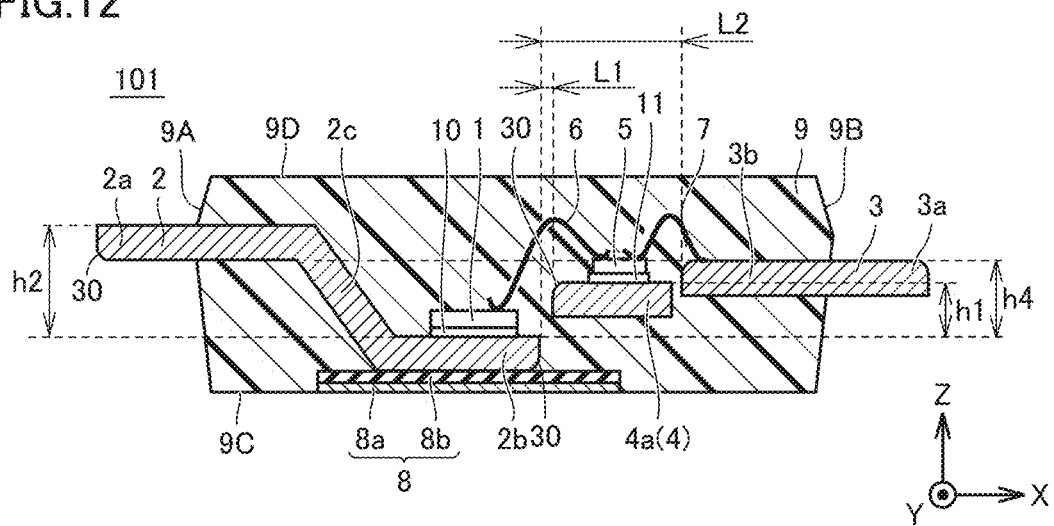
FIG. 12 is a cross-sectional view along a line XII-XII in FIG. 11.
Figure 13:
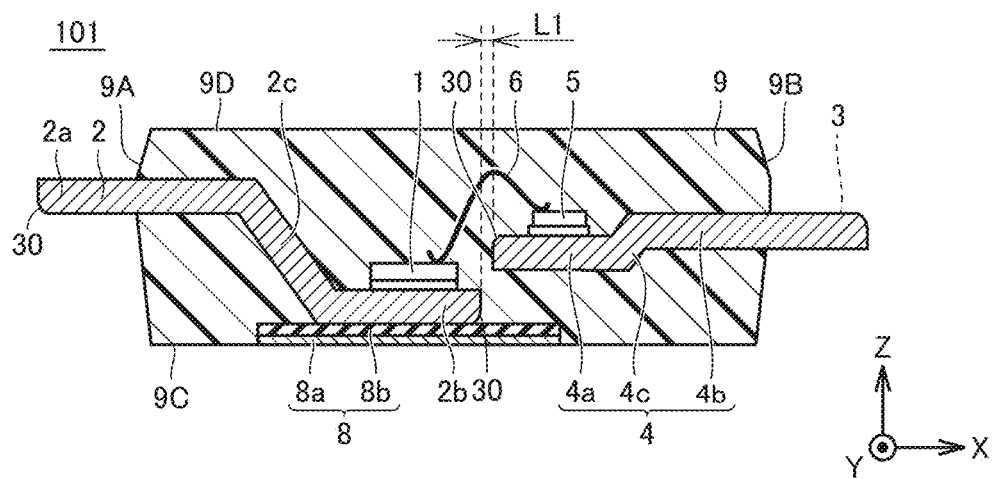
FIG. 13 is an end view along a line XIII-XIII in FIG. 11.

As shown in FIGS. 11 to 13, while a semiconductor device 101 according to Embodiment 2 has a configuration basically similar to semiconductor device 100 according to Embodiment 1, semiconductor device 101 differs from semiconductor device 100 in that droop surface 30 of each of second lead frame 3 and intermediate frame 4 faces opposite to droop surface 30 of first lead frame 2.

The height of first portion 2a from lower surface 9C of sealing member 9 is higher than the height of fourth portion 3a from lower surface 9C of sealing member 9. The aforementioned distance h1 is longer than distance h4, in second direction Z, between the upper surface of first portion 2a of first lead frame 2 and the upper surface of fourth portion 3a of second lead frame 3. The lower surface of first portion 2a of first lead frame 2 is coplanar with the upper surface of fourth portion 3a and fifth portion 3b of second lead frame or located higher than this upper surface.

The upper surface of seventh portion 4a of intermediate frame 4 is located higher than the lower surface of fourth portion 3a and fifth portion 3b of second lead frame 3.

Droop surface 30 of each of second lead frame 3 and intermediate frame 4 faces upward, for example. Droop surface 30 of first lead frame 2 faces downward, for example. Droop surface 30 of each of second lead frame 3 and intermediate frame 4 may face downward and droop surface 30 of first lead frame 2 may face upward.

<Method of Manufacturing Semiconductor Device>

A method of manufacturing semiconductor device 101 according to Embodiment 2 is basically similar in features to the method of manufacturing semiconductor device 100 according to Embodiment 1, except that the former method differs from the method of manufacturing semiconductor device 100 in that the second bending process in the first step is performed on second sheet portion 23 and third sheet portion 24.

Figure 14:
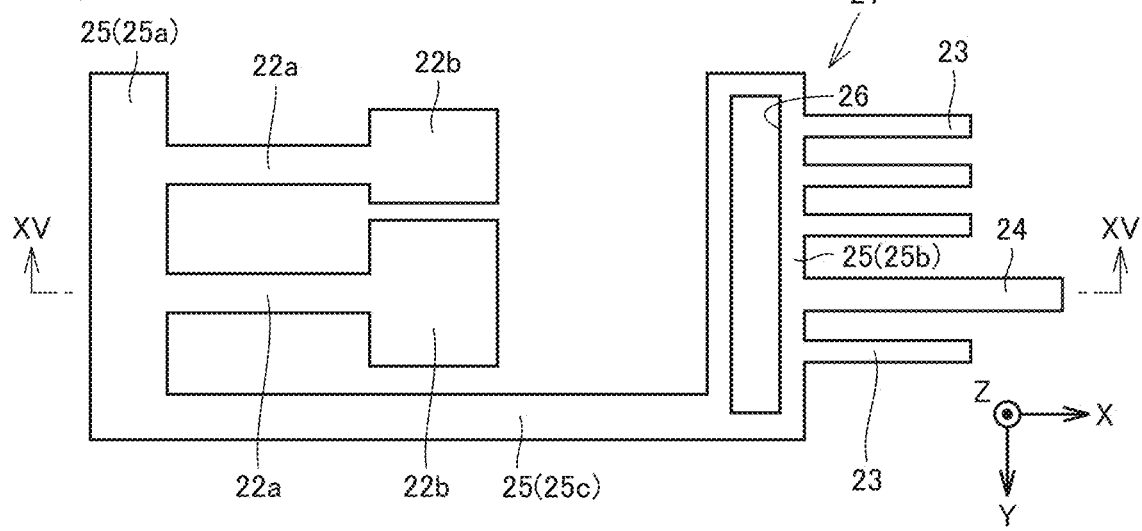
FIG. 14 is a partial plan view showing a step of a method of manufacturing the semiconductor device shown in FIGS. 11 to 13.
Figure 15:
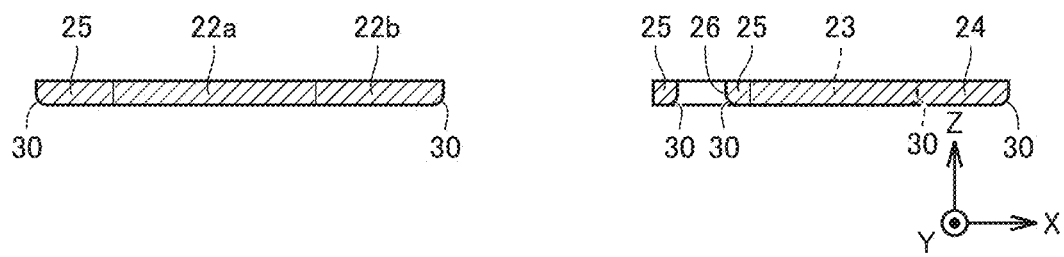
FIG. 15 is a cross-sectional view along a line XV-XV in FIG. 14.

In the first step, initially electrically conductive member 21 shown in FIGS. 14 and 15 is formed by a stamping process. Electrically conductive member 21 shown in FIGS. 14 and 15 is basically similar in configuration to electrically conductive member 20 shown in FIGS. 5 and 6, except that the former differs from electrically conductive member 20 in that second sheet portion 23 is located to extend away from first sheet portion 22 with respect to second frame portion 25b in first direction X. The other end, in first direction X, of second sheet portion 23 is connected to a part of second frame portion 25b located away from first sheet portion 22 with respect to opening 26. In other words, second sheet portion 23 and third sheet portion 24 are arranged side by side in second direction Y.

Figure 16:
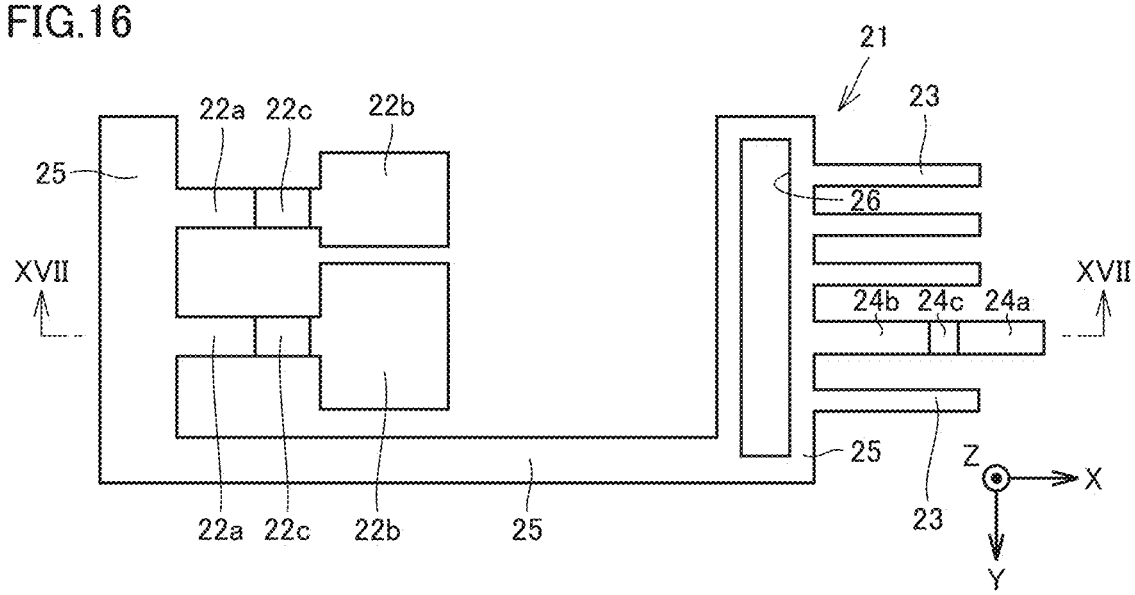
FIG. 16 is a partial plan view showing a step, after the step shown in FIG. 14, of the method of manufacturing the semiconductor device shown in FIGS. 11 to 13.
Figure 17:
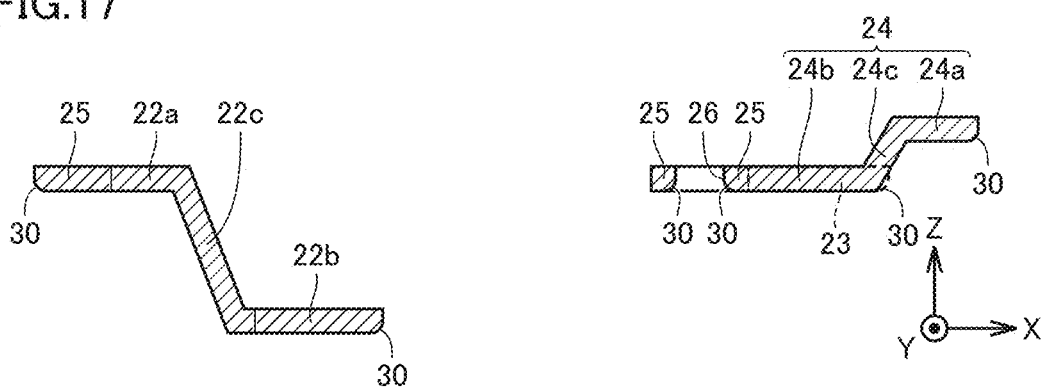
FIG. 17 is a cross-sectional view along a line XVII-XVII in FIG. 16.

Next, the first bending process is performed on electrically conductive member 21 shown in FIGS. 14 and 15. In this way, electrically conductive member 21 shown in FIGS. 16 and 17 is formed. The first being process for electrically conductive member 21 is performed similarly to the first bending process for electrically conductive member 20.

Figure 18:
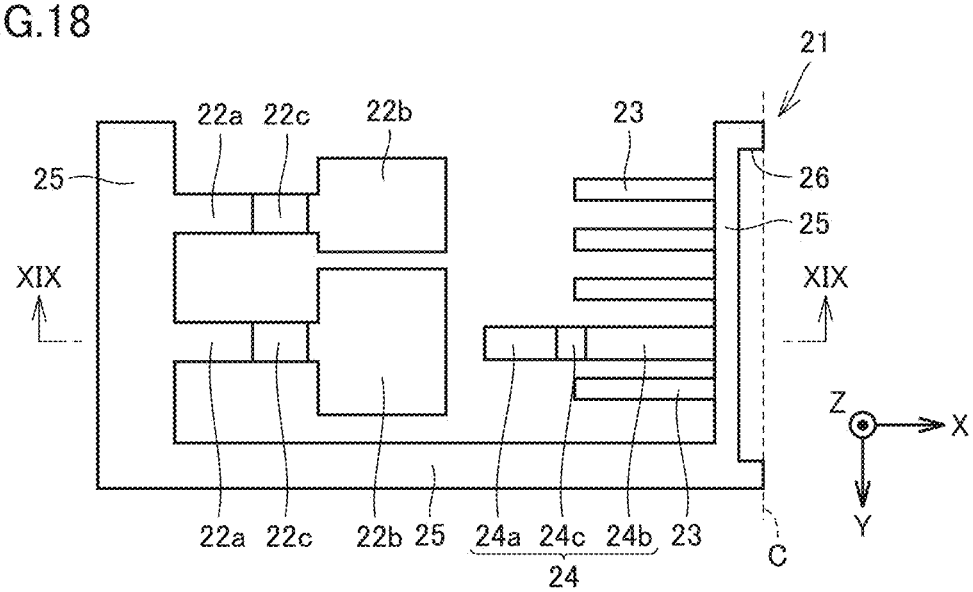
FIG. 18 is a partial plan view showing a step, after the step shown in FIG. 16, of the method of manufacturing the semiconductor device shown in FIGS. 11 to 13.
Figure 19:
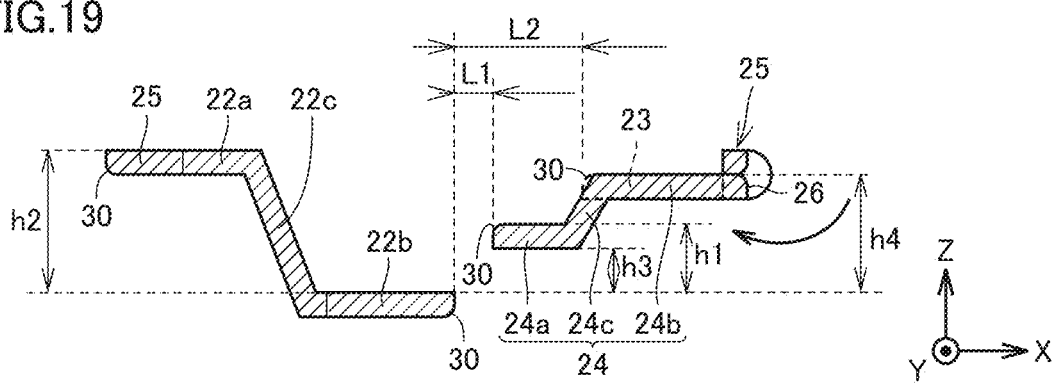
FIG. 19 is a cross-sectional view along a line XIX-XIX in FIG. 18.

Next, the second bending process is performed on electrically conductive member 21 shown in FIGS. 16 and 17. Accordingly, electrically conductive member 21 shown in FIGS. 18 and 19 is formed. The second bending process for electrically conductive member 21 is performed basically similarly to the second bending process for electrically conductive member 20, except that the former folds second sheet portion 23 together with third sheet portion 24.

As shown in FIGS. 18 and 19, second sheet portion 23 and third sheet portion 24 of electrically conductive member 21 are folded along folding line C defined as a centerline. Accordingly, second sheet portion 23 and third sheet portion 24 are located lower than first sheet portion 22 in second direction Z.

As shown in FIG. 19, droop surface 30 of each of second sheet portion 23 and third sheet portion 24 faces opposite to droop surface 30 of first sheet portion 22 in second direction Z. Droop surface 30 of each of second sheet portion 23 and third sheet portion 24 faces upward, and droop surface 30 of first sheet portion 22 faces downward.

The distance, in first direction X, between second portion 22b and seventh portion 24a is the aforementioned distance L1. The distance, in second direction Z, between the upper surface of second portion 22b and the upper surface of seventh portion 24a is the aforementioned distance h1. The distance, in second direction Z, between the upper surface of first portion 22a and the upper surface of second portion 22b is the aforementioned distance h2. The distance, in second direction Z, between the upper surface of second portion 22b and the lower surface of seventh portion 24a is the aforementioned distance h3. The distance, in first direction X, between second portion 22b and second sheet portion 23 is the aforementioned distance L2. The distance, in second direction Z, between the upper surface of second portion 22b and the upper surface of second sheet portion 23 is the aforementioned distance h4.

The second step, the third step, and the fourth step are performed similarly to those of the method of manufacturing semiconductor device 100. In this way, semiconductor device 101 is manufactured.

Semiconductor device 101 is basically similar in configuration to semiconductor device 100, and can therefore produce similar effects to those of semiconductor device 100.

Second lead frame 3 of semiconductor device 101 may also have the sixth portion formed by the first bending process.

Embodiment 3

Figure 20:
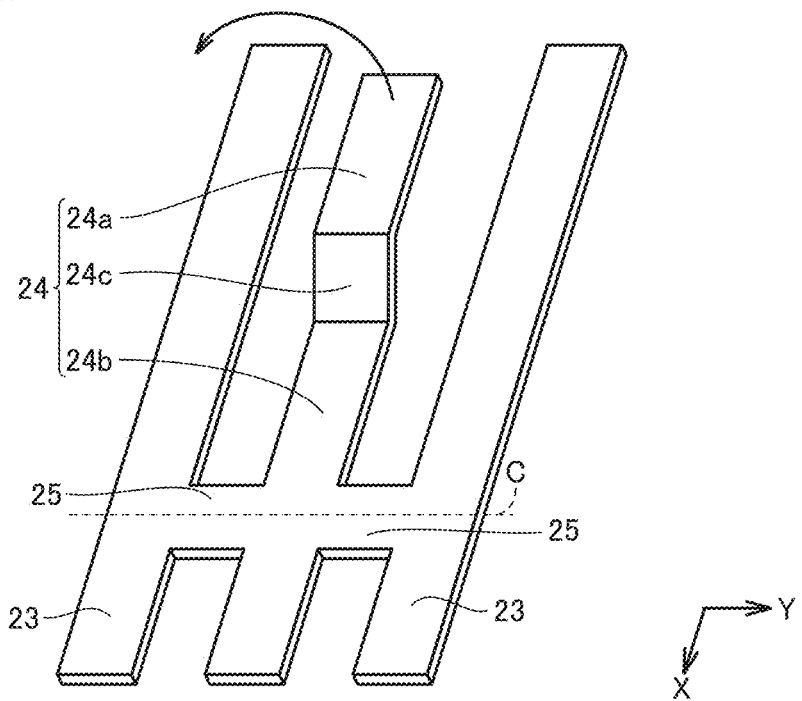
FIG. 20 is a partial perspective view showing a modification of the method of manufacturing the semiconductor device shown in FIGS. 11 to 13.
Figure 21:
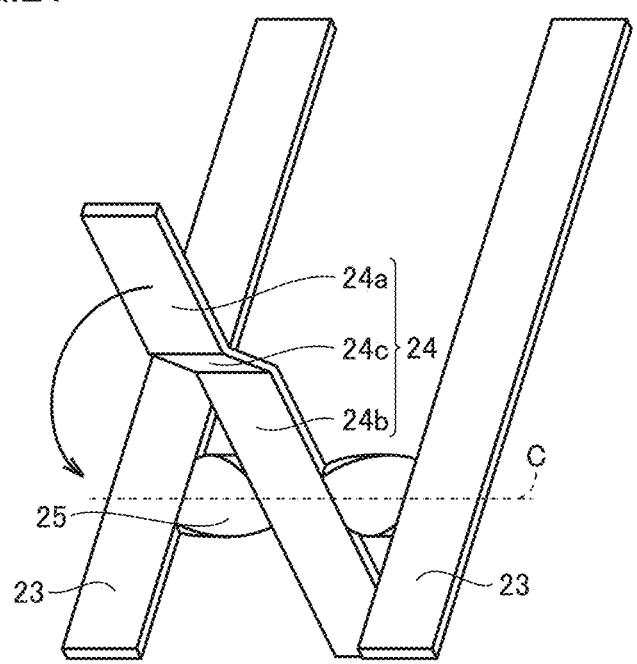
FIG. 21 is a partial perspective view showing a modification of the method of manufacturing the semiconductor device shown in FIGS. 11 to 13.

A method of manufacturing a semiconductor device according to Embodiment 3 is basically similar in features to the method of manufacturing semiconductor device 100 according to Embodiment 1, except that the former differs from the method of manufacturing semiconductor device 100 in that a twisting process as shown in FIGS. 20 and 21 is performed in the second bending process, instead of the folding process along folding line C defined as a centerline.

The twisting process is performed on at least third sheet portion 24. In the twisting process shown in FIGS. 20 and 21, third sheet portion 24 is twisted along a twisting centerline C to be turned upside down. Second sheet portion 23 is not twisted. The width, in first direction X, of frame 25 connecting second sheet portion 23 and third sheet portion 24 is sufficiently narrower than the width, in first direction X, of second sheet portion 23 and third sheet portion 24.

In the semiconductor device manufactured in this way, the height of eighth portion 4b of intermediate frame 4 from lower surface 9C of sealing member 9 is equal to the height of first portion 2a of first lead frame 2 and fourth portion 3a of second lead frame 3 from lower surface 9C of sealing member 9.

The semiconductor device manufactured by the method of manufacturing a semiconductor device according to Embodiment 3 is basically similar in configuration to semiconductor device 100, and can therefore produce similar effects to those of semiconductor device 100.

The twisting process may be performed on second sheet portion 23 and third sheet portion 24 on which the first bending process has been performed. Such a twisting process is appropriate for manufacturing semiconductor device 100 having second lead frame 3 including the aforementioned sixth portion. In the semiconductor device manufactured in this way, the droop surface of each of second lead frame 3 and intermediate frame 4 faces opposite to the droop surface of first lead frame 2, like the droop surfaces of semiconductor device 101.

Embodiment 4

Figure 22:
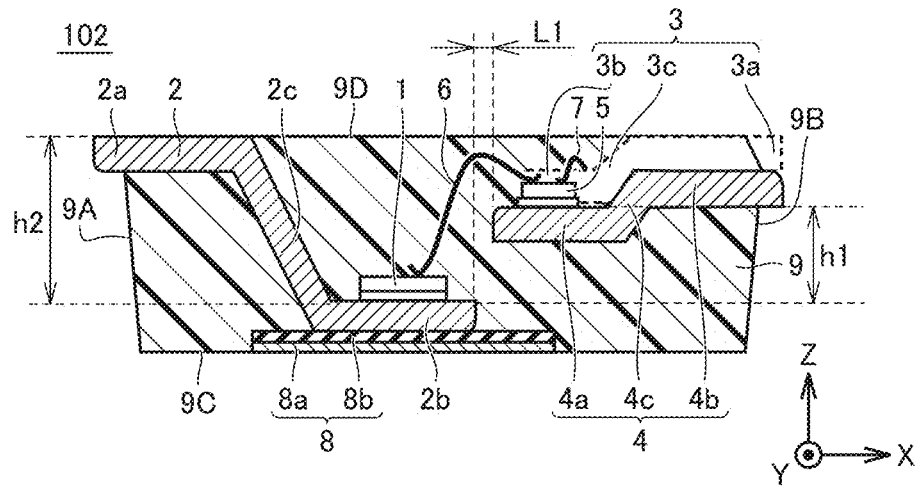
FIG. 22 is a cross-sectional view of a semiconductor device according to Embodiment 3.

As shown in FIG. 22, a semiconductor device 102 according to Embodiment 4 is basically similar in configuration to semiconductor device 100 according to Embodiment 1, except that the former differs from semiconductor device 100 in that first portion 2a of first lead frame 2 is exposed from upper surface 9D of sealing member 9.

The upper surface of fourth portion 3a of second lead frame 3 is also exposed from upper surface 9D of sealing member 9. Second lead frame 3 includes fourth portion 3a, fifth portion 3b, and sixth portion 3c. Fifth portion 3b and sixth portion 3c are embedded in sealing member 9. Second interconnect member 7 is bonded to the upper surface of fifth portion 3b or the upper surface of sixth portion 3c.

The height of the upper surface of fifth portion 3b from lower surface 9C of sealing member 9 is more than or equal to the height of the upper surface of seventh portion 4a of intermediate frame 4 from lower surface 9C. Preferably, for the sake of enhancing the workability (bonding ability) for forming second interconnect member 7, the height of the upper surface of fifth portion 3c from lower surface 9C of sealing member 9 is higher than the height of the upper surface of seventh portion 4a of intermediate frame 4 from lower surface 9C. In other words, the upper surface of fifth portion 3b is located higher than the upper surface of seventh portion 4a. The upper surface of fifth portion 3b is located higher than the upper surface of electronic component 5 mounted on the upper surface of seventh portion 4a, for example.

Fourth portion 3a of second lead frame 3 is located side by side in third direction Y with eighth portion 4b of intermediate frame 4. Fifth portion 3b of second lead frame 3 is located side by side in third direction Y with seventh portion 4a of intermediate frame 4. Sixth portion 3c of second lead frame 3 is located side by side in third direction Y with ninth portion 4c of intermediate frame 4.

Semiconductor device 102 according to Embodiment 4 is basically similar in configuration to semiconductor device 100, and can therefore produce similar effects to those of semiconductor device 100.

The aforementioned distance h2 of semiconductor device 102 is longer than the aforementioned distance h2 of semiconductor device 100. Meanwhile, the aforementioned distance L1 of semiconductor device 102 is substantially equal to the aforementioned distance L1 of semiconductor device 100. Therefore, when semiconductor device 102 and semiconductor device 100 that are substantially identical in dimensions to each other are compared with each other, the electrical insulation distance of semiconductor device 102 is longer than the electrical insulation distance of semiconductor device 100.

A method of manufacturing semiconductor device 102 is basically similar in features to the method of manufacturing semiconductor device 100, except that the features of a mold used in the third step are different from those of the mold used for the method of manufacturing semiconductor device 100.

Preferably, for the third step, a method is used for preventing burrs formed by the sealing material (resin burrs for example) from being formed on upper surface 9D of sealing member 9. For example, a film is placed on a portion in the mold that is to form upper surface 9D of sealing member 9, and thereafter a surface of each of first sheet portion 22 and second sheet portion 23 that is to be exposed is placed in contact with the film. Further, an adhesive tape is attached to a surface, to be exposed, of each of first sheet portion 22 and second sheet portion 23, and thereafter they are placed in the mold. The film and the adhesive tape are detached from sealing member 9 after molding of sealing member 9 is completed. The material forming the film and the adhesive tape includes polyimide, for example.

Figure 23:
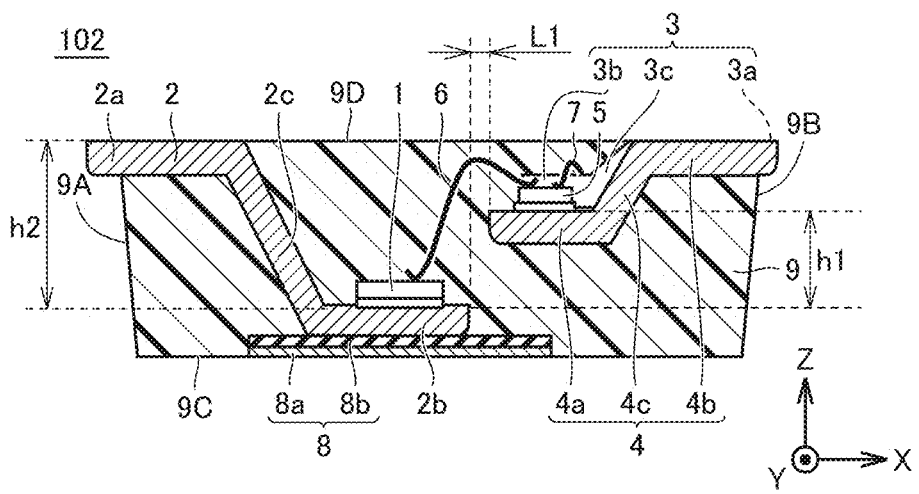
FIG. 23 is a cross-sectional view of a semiconductor device according to Embodiment 4.

As shown in FIG. 23, the upper surface of eighth portion 4b of intermediate frame 4 in semiconductor device 102 may also be exposed from upper surface 9D of sealing member 9.

Semiconductor device 102 shown in FIG. 23 may be manufactured by performing, in the first step, the first bending process and the second bending process on at least second sheet portion 23 and third sheet portion 24, for example. The second bending process may either be a folding process or a twisting process.

Figure 24:
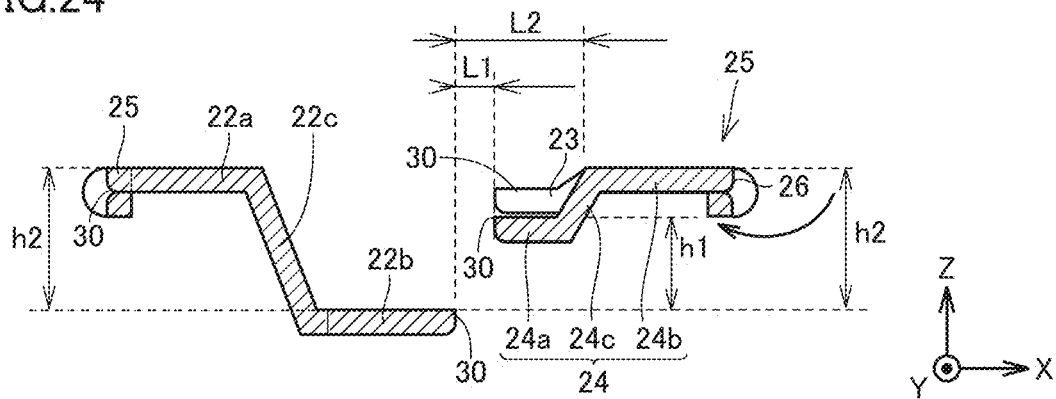
FIG. 24 is a cross-sectional view of a semiconductor device according to Embodiment 5.

FIG. 24 is a partial cross-sectional view of electrically conductive member 20 having undergone a folding process in the second bending process for the method of manufacturing semiconductor device 102 shown in FIG. 23. First sheet portion 22, second sheet portion 23, and third sheet portion 24 are each subjected to the second bending process so that respective surfaces of first sheet portion 22, second sheet portion 23, and third sheet portion 24 to be exposed are coplanar.

Semiconductor device 102 may also be manufactured by performing the twisting process on second sheet portion 23 and third sheet portion 24 in the second bending process.

Embodiment 5

Figure 25:
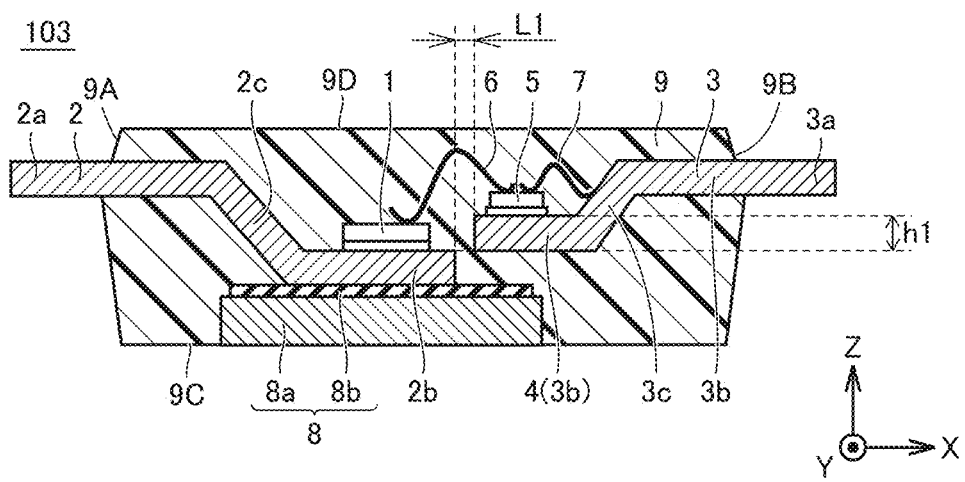
FIG. 25 is a partial cross-sectional view showing a step of a method of manufacturing the semiconductor device according to Embodiment 5.

As shown in FIG. 25, a semiconductor device 103 according to Embodiment 5 is basically similar in configuration to semiconductor device 100 according to Embodiment 1, except that the former differs from semiconductor device 100 in that intermediate frame 4 is continuous to second lead frame 3.

Intermediate frame 4 is continuous to fifth portion 3b of second lead frame 3. In other words, all the frames formed on the second side surface 9S side are formed through the first bending process and the second bending process. Intermediate frame 4 shown in FIG. 25 is formed of only seventh portion 4a of intermediate frame 4 shown in FIG. 4.

The thickness of electrically conductive member 8a of thermally conductive member 8 is larger than the thickness of electrically insulating member 8b, for example. The thickness of electrically conductive member 8a of thermally conductive member 8 is 2 mm or more, for example. The material forming electrically conductive member 8a includes Al for example. As described above, such thermally conductive member 8 has a higher heat dissipation property relative to thermally conductive member 8 in which the thickness of electrically conductive member 8a is substantially identical to the thickness of electrically insulating member 8b. Further, when a comparison is made between two semiconductor devices 103 that are substantially identical to each other in terms of the aforementioned distance h2, and different from each other only in the thickness of thermally conductive member 8, the electrical insulation distance of semiconductor device 103 including thermally conductive member 8 having a relatively larger thickness is longer than the electrical insulation distance of semiconductor device 103 including thermally conductive member 8 having a relatively smaller thickness.

Semiconductor device 103 according to Embodiment 5 is basically similar in configuration to semiconductor device 100, and can therefor produce similar effects to those of semiconductor device 100.

A method of manufacturing semiconductor device 103 is basically similar in features to the method of manufacturing semiconductor device 100, except that the former differs from the method of manufacturing semiconductor device 100 in that second sheet portion 23 and third sheet portion 24 are formed integrally in the first step.

For the method of manufacturing semiconductor device 103 shown in FIG. 25, the second bending process is performed as twisting process. Even when the second bending process is performed as folding process, semiconductor device 103 in which intermediate frame 4 is continuous to second lead frame 3 can still be manufactured.

Embodiment 6

Figure 26:
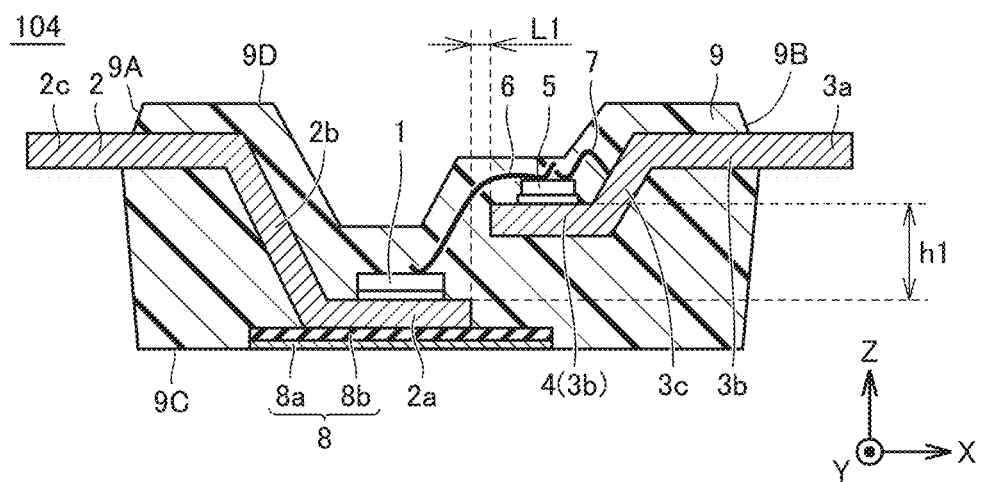
FIG. 26 is a cross-sectional view of a semiconductor device according to Embodiment 6.

As shown in FIG. 26, a semiconductor device 104 according to Embodiment 6 is basically similar in configuration to semiconductor device 100 according to Embodiment 1, except that the former differs from semiconductor device 100 in that upper surface 9D of sealing member 9 has protrusions/depressions.

The distance in second direction Z between the upper surface of sealing member 9 and each member sealed in sealing member 9 is set to at least the shortest distance for achieving a required dielectric strength. For example, upper surface 9D above a region located between third portion 2c of first lead frame 2, and second lead frame 3 and intermediate frame 4, in first direction X, is depressed relative to upper surface 9D above first portion 2a and third portion 2c of first lead frame 2, second lead frame 3, and intermediate frame 4.

Semiconductor device 104 according to Embodiment 6 is basically similar in configuration to semiconductor device 100, and can therefor produce similar effects to those of semiconductor device 100.

Further, semiconductor device 104 has a reduced volume and a reduced weight of sealing member 9, as compared with those of the sealing member having flat upper surface 9D. As a result, semiconductor device 104 has a reduced weight and a reduced volume relative to those of the semiconductor device having flat upper surface 9D.

Embodiment 7

Figure 27:
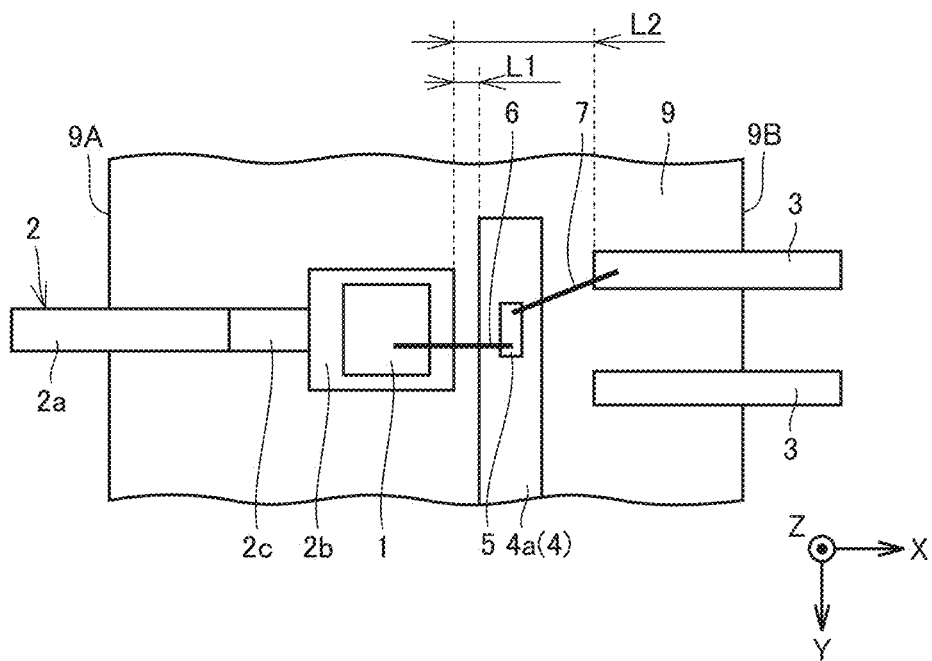
FIG. 27 is a plan view showing an inside of a sealing member of a semiconductor device according to Embodiment 7.

As shown in FIG. 27, a semiconductor device 105 according to Embodiment 7 is basically similar in configuration to semiconductor device 100 according to Embodiment 1, except that the former differs from semiconductor device 100 in that seventh portion 4a of intermediate frame 4 extends in third direction Y.

Seventh portion 4a of intermediate frame 4 extends in third direction Y crossing first direction X in which seventh portion 4a, eighth portion 4b and ninth portion 4c are continuous. As seen in second direction Z, the shape of intermediate frame 4 is an L shape, for example. The distance in first direction X between first lead frame 2 and a portion of seventh portion 4a extending in third direction Y is L1.

Semiconductor device 105 according to Embodiment 7 is basically similar in configuration to semiconductor device 100, and can therefore produce similar effects to those of semiconductor device 100.

A method of manufacturing semiconductor device 105 is basically similar in features to the method of manufacturing semiconductor device 100, except that the former differs from the method of manufacturing semiconductor device 100 in that third sheet portion 24 formed by the stamping process in the first step includes a portion extending in third direction Y.

Figure 28:
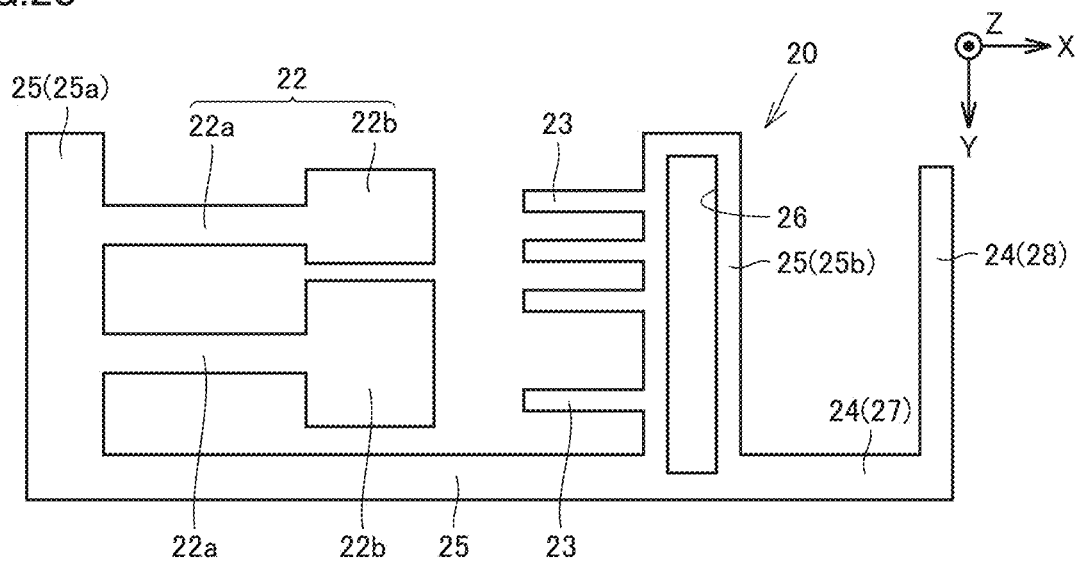
FIG. 28 is a partial plan view showing a step of a method of manufacturing the semiconductor device shown in FIG. 27.

As shown in FIG. 28, third sheet portion 24 including a part 27 extending in first direction X and a part 28 extending in third direction Y is formed.

Part 27 of third sheet portion 24 extending in first direction X is located to extend, in first direction X, away from first sheet portion 22, with respect to second frame portion 25b. One end, in first direction X, of part 27 extending in first direction X, is connected to a part of second frame portion 25b located away from first sheet portion 22 with respect to opening 26. The other end, in first direction X, of part 27 extending in first direction X is connected to one end, in third direction Y, of part 28 extending in third direction Y. Pan 28 extending in third direction Y is located between first sheet portion 22 and second sheet portion 23 in first direction X.

Next, the first bending process is performed on electrically conductive member 20 shown in FIG. 28. In this way, electrically conductive member 20 shown in FIG. 29 is formed.

Figure 29:
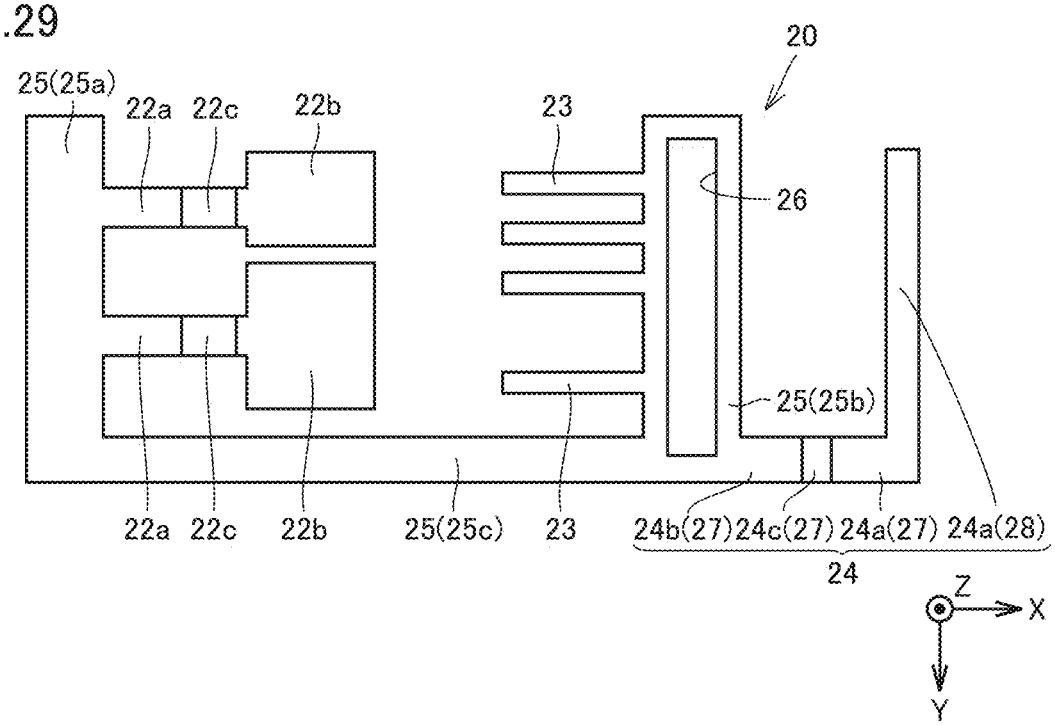
FIG. 29 is a partial plan view showing a step, after the step shown in FIG. 28, of the method of manufacturing the semiconductor device shown in FIG. 27.

As shown in FIG. 29, seventh portion 24a, eighth portion 24b, and ninth portion 24c am formed in third sheet portion 24.

Seventh portion 24a is made up of a portion of part 27 extending in first direction X, and the whole of part 28 extending in third direction Y. Seventh portion 24a is located higher than the upper surface of eighth portion 24b in second direction Z.

Next, the second bending process is performed on electrically conductive member 20 shown in FIG. 29. In this way, electrically conductive member 20 shown in FIG. 30 is formed.

Figure 30:
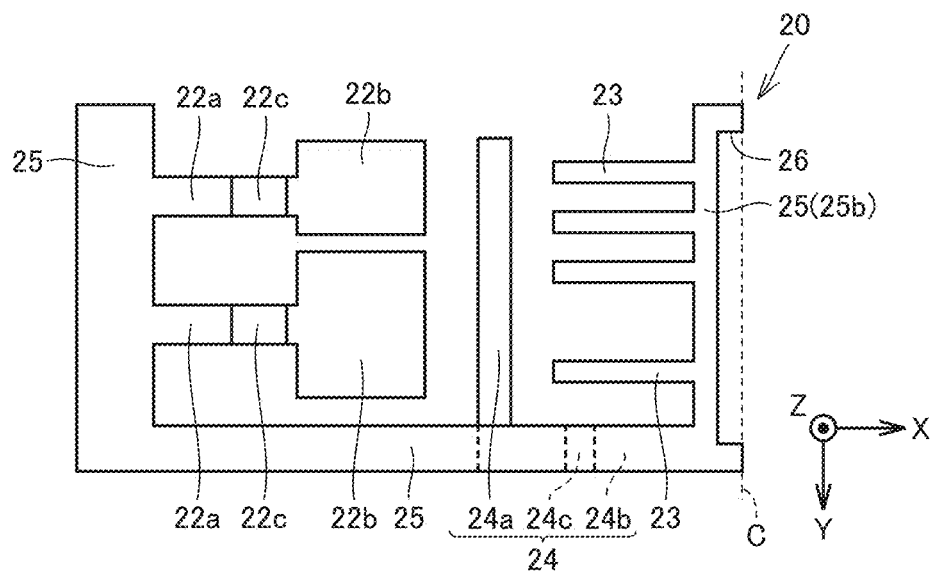
FIG. 30 is a partial plan view showing a step, after the step shown in FIG. 29, of the method of manufacturing the semiconductor device shown in FIG. 27.

As shown in FIG. 30, third sheet portion 24 of electrically conductive member 20 is folded along folding line C defined as a center. Accordingly, third sheet portion 24 is located lower than first sheet portion 22 and second sheet portion 23 in second direction Z. A part of seventh portion 24a of third sheet portion 24 that extends in the third direction is located between first sheet portion 22 and second sheet portion 23 in first direction X.

Embodiment 8

In the present embodiment, above-described semiconductor devices 100 to 105 according to Embodiments 1 to 7 are each applied to a power converter. While the present disclosure is not limited to a specific power converter, the following description is given of a case, as Embodiment 8, where the present disclosure is applied to a three-phase inverter.

Figure 31:
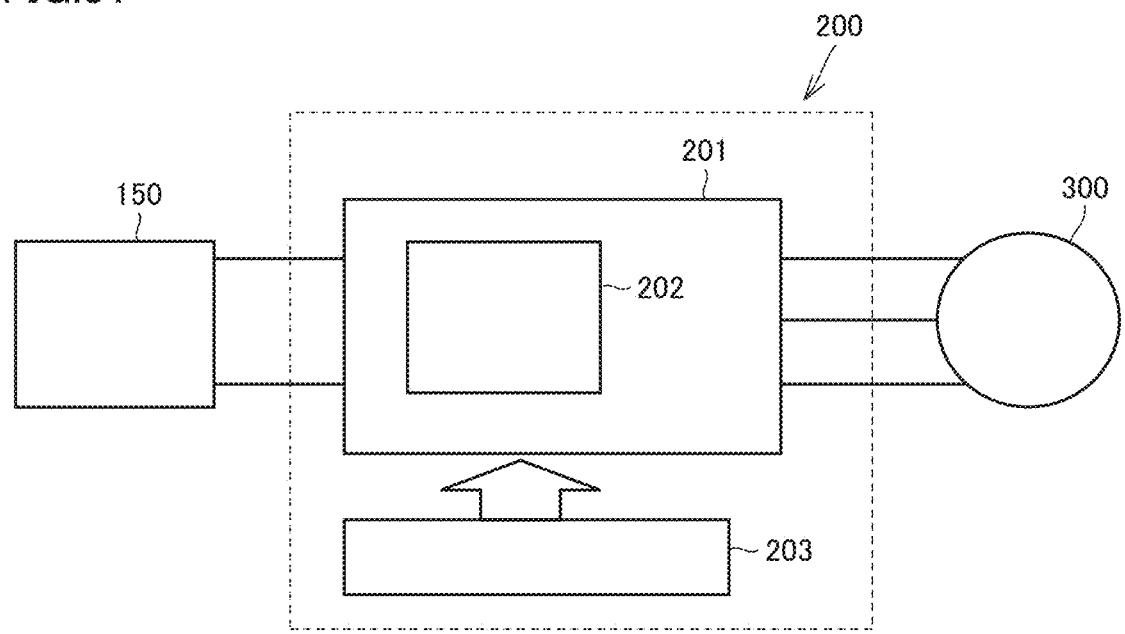
FIG. 31 is a block diagram showing a configuration of a power conversion system to which a power converter according to Embodiment 8 is applied.

FIG. 31 is a block diagram showing a configuration of a power conversion system to which a power converter according to the present embodiment is applied.

The power conversion system shown in FIG. 31 includes a power supply 150, a power converter 200, and a load 300. Power supply 150 is a DC power supply and supplies DC power to power converter 200. Power supply 150 may be configured in various forms such as DC system, solar battery, storage battery, for example, or may be configured in the form of a rectifier circuit or AC/DC converter connected to an AC system. Power supply 150 may also be configured in the form of a DC/DC converter that converts DC power output from a DC system to predetermined electric power.

Power converter 200 is a three-phase inverter connected between power supply 150 and load 300, converts DC power supplied from power supply 150 to AC power, and supplies the AC power to load 300. Power converter 200 includes, as shown in FIG. 31, a main conversion circuit 201 that converts DC power to AC power and outputs the AC power, and a control circuit 203 that outputs, to main conversion circuit 201, a control signal for controlling main conversion circuit 201.

Load 300 is a three-phase electric motor driven by AC power supplied from power converter 200. Load 300 is not limited to a specific use, but is an electric motor to be mounted on a variety of electrical devices, and used, for example, as an electric motor for a hybrid vehicle or an electric vehicle, a railroad car, an elevator, or an air conditioner.

In the following, details of power converter 200 are described. Main conversion circuit 201 includes a switching element and a freewheeling diode (not shown), and the switching element is switched to convert DC power supplied from power supply 150 to AC power, and supply the AC power to load 300. The specific circuit configuration of main conversion circuit 201 may be any of various ones. Main conversion circuit 201 according to the present embodiment is a two-level three-phase full-bridge circuit that can be made up of six switching elements and six freewheeling diodes connected in anti-parallel with respective switching elements. At least any of the switching elements and the freewheeling diodes of main conversion circuit 201 is a switching element or a freewheeling diode of semiconductor device 202 corresponding to any of respective semiconductor devices according to Embodiments 1 to 7 as described above. Of the six switching elements, every two switching elements are connected in series to each other to form upper and lower arms, and each pair of the upper and lower arms forms each phase (U phase, V phase, W phase) of the full-bridge circuit. Respective output terminals of the pairs of the upper and lower arms, i.e., three output terminals of main conversion circuit 201, are connected to load 300.

While main conversion circuit 201 includes a drive circuit (not shown) that drives each switching element, the drive circuit may be incorporated in semiconductor device 202 or the drive circuit may be included separately from semiconductor device 202. The drive circuit generates a drive signal that drives the switching element of main conversion circuit 201, and supplies the drive signal to a control electrode of the switching element of main conversion circuit 201. Specifically, in accordance with a control signal from control circuit 203 described later herein, a drive signal bringing the switching element into the ON state and a drive signal bringing the switching element into the OFF state are output to the control electrode of each switching element. When the switching element is to be kept in the ON state, the drive signal is a voltage signal (ON signal) more than or equal to a threshold voltage of the switching element and, when the switching element is to be kept in the OFF state, the drive signal is a voltage signal (OFF signal) less than or equal to the threshold voltage of the switching element.

Control circuit 203 controls the switching elements of main conversion circuit 201 such that desired electric power is supplied to load 300. Specifically, the time (ON time) for which each switching element of main conversion circuit 201 should be in the ON state is calculated, based on electric power to be supplied to load 300. For example, main conversion circuit 201 can be controlled by PWM control that modulates the ON time of the switching element depending on the voltage to be output, for example. At each point of time, a control command (control signal) is output to the drive circuit of main conversion circuit 201, so that the ON signal is output to the switching element to be brought into the ON state and the OFF signal is output to the switching element to be brought into the OFF state. In accordance with this control signal, the drive circuit outputs, to the control electrode of each switching element, the ON signal or the OFF signal as the drive signal.

For the power converter according to the present embodiment, at least any of semiconductor devices 100 to 105 according to Embodiments 1 to 7 is applied as semiconductor device 202 forming main conversion circuit 201, which enables downsizing relative to a power converter having the conventional semiconductor device, while ensuring the electrical insulation distance.

In connection with the present embodiment, an example is described above in which the present disclosure is applied to a two-level three-phase inverter. The present disclosure, however, is not limited to this, but is applicable to various power converters. While the power converter in the present embodiment is the two-level power converter, it may be a three-level or multilevel power converter, and the present disclosure may be applied to a single-phase inverter if electric power is to be applied to a single-phase load. Moreover, if electric power is to be supplied to a DC load or the like, the present disclosure may also be applied to a DC/DC converter or AC/AC converter.

For the power converter to which the present disclosure is applied, the above-described load is not limited to an electric motor, and the power converter can also be used as a power supply apparatus for an electrical discharge machining device or a laser machining device, or for an induction heating cooker or a wireless power feeding system, for example, and can further be used as a power conditioner such as photovoltaic system or power storage system.

While the embodiments of the present disclosure have been described, the above-described embodiments can also be modified in various manners. The basic scope of the present disclosure is not limited to the above-described embodiments. It is intended that the basic scope of the present disclosure is defined by claims, and encompasses all modifications equivalent in meaning and scope to the claims.

REFERENCE SIGNS LIST 1 semiconductor element; 2, 402 first lead frame; 2a, 402a first portion; 2b, 402b second portion; 2c third portion; 3, 403 second lead frame; 3a fourth portion; 3b fifth portion; 3c sixth portion; 4 intermediate frame; 4a seventh portion; 4b eighth portion; 4c ninth portion; 5 electronic component; 6 first interconnect member; 7 second interconnect member; 8 thermally conductive member; 8a electrically conductive member; 8b electrically insulating member; 9 sealing member; 9A first side surface; 9B second side surface; 9C lower surface; 9D upper surface; 10, 11 bonding member; 20, 21 electrically conductive member; 22 first sheet portion; 22a first portion; 22b second portion; 22c third portion; 23 second sheet portion; 24 third sheet portion; 24a seventh portion; 24b eighth portion; 24c ninth portion; 25 frame portion; 25a first frame portion; 25b second frame portion; 25c third frame portion; 26 opening; 30 droop surface; 100, 101, 102, 103, 104, 202 semiconductor device; 150 power supply; 200 power converter; 201 main conversion circuit; 203 control circuit; 300 load

The invention claimed is:

1. A semiconductor device comprising:
   a semiconductor element, a first lead frame, a second lead frame, and a thermally conductive member; and
   a sealing member sealing the semiconductor element, the first lead frame, the second lead frame, and the thermally conductive member, wherein
   the sealing member has a first side surface and a second side surface opposite to each other in a first direction, and a lower surface extending in the first direction,
   the first lead frame includes: a first portion exposed from the first side surface; a second portion located closer to the lower surface than the first portion in a second direction crossing the lower surface; and a third portion electrically connecting the first portion and the second portion to each other and inclined with respect to each of the first portion and the second portion,
   the second lead frame includes a fourth portion exposed from the second side surface, and a fifth portion spaced from the second portion in the first direction and the second direction,
   the second portion, the third portion, and the fifth portion are sealed in the sealing member,
   the semiconductor element is mounted on an upper surface of the second portion,
   the thermally conductive member includes a portion located opposite to the semiconductor element with respect to the second portion, thermally connected to the second portion, and exposed from the lower surface,
   the semiconductor device further comprises an intermediate frame which is located between the second portion and the fifth portion at least in the second direction, and on which an element forming a part of an interconnect circuit including the first lead frame and the second lead frame is mounted,
   a distance, in the first direction, between the second portion and the intermediate frame is shorter than a distance, in the second direction, between an upper surface of the first portion and the upper surface of the second portion,
   an end face of the intermediate frame that is located at a side of the first lead frame in the first direction is located closer to the second lead frame than an end face of the second portion that is located at a side of the second lead frame in the first direction, and
   the intermediate frame is entirely located lower than the second lead frame in the second direction.

2. The semiconductor device according to claim 1, wherein the distance, in the first direction, between the second portion and the intermediate frame is shorter than a distance, in the second direction, between the upper surface of the second portion and an upper surface of the intermediate frame.

3. The semiconductor device according to claim 1, wherein a shortest distance between the second portion and the intermediate frame is shorter than a shortest distance between the second portion and the second lead frame.

4. The semiconductor device according to claim 1, wherein a distance, in the second direction, between the upper surface of the first portion and the upper surface of the second portion is 2 mm or more.

5. The semiconductor device according to claim 1, wherein the first portion is exposed from the first side surface located higher than a center, in the second direction, of the sealing member.

6. The semiconductor device according to claim 1, wherein
the sealing member further has an upper surface located opposite to the lower surface, and
a part of the first portion is exposed from the upper surface of the sealing member.

7. A semiconductor device comprising:
a semiconductor element, a first lead frame, a second lead frame, and a thermally conductive member; and
a sealing member sealing the semiconductor element, the first lead frame, the second lead frame, and the thermally conductive member, wherein
the sealing member has a first side surface and a second side surface opposite to each other in a first direction, and a lower surface extending in the first direction,
the first lead frame includes: a first portion exposed from the first side surface; a second portion located closer to the lower surface than the first portion in a second direction crossing the lower surface; and a third portion electrically connecting the first portion and the second portion to each other and inclined with respect to each of the first portion and the second portion,
the second lead frame includes a fourth portion exposed from the second side surface, and a fifth portion spaced from the second portion in the first direction and the second direction,
the second portion, the third portion, and the fifth portion are sealed in the sealing member,
the semiconductor element is mounted on an upper surface of the second portion,
the thermally conductive member includes a portion located opposite to the semiconductor element with respect to the second portion, thermally connected to the second portion, and exposed from the lower surface,
the semiconductor device further comprises an intermediate frame which is located between the second portion and the fifth portion at least in the second direction, and on which an element forming a part of an interconnect circuit including the first lead frame and the second lead frame is mounted,
a distance, in the first direction, between the second portion and the intermediate frame is shorter than a distance, in the second direction, between an upper surface of the first portion and the upper surface of the second portion, and
an end face of the intermediate frame that is located at a side of the first lead frame in the first direction is located closer to the second lead frame than an end face of the second portion that is located at a side of the second lead frame in the first direction,
wherein the intermediate frame is continuous to the second lead frame.

8. The semiconductor device according to claim 1, wherein
each of the first lead frame, the second lead frame, and the intermediate frame has a droop surface, and
the droop surface on the intermediate frame faces opposite, in the second direction, to the droop surface on each of the first lead frame and the second lead frame.

9. The semiconductor device according to claim 1, wherein
each of the first lead frame, the second lead frame, and the intermediate frame has a droop surface, and
the droop surface on each of the intermediate frame and the second lead frame faces opposite, in the second direction, to the droop surface on the first lead frame.

10. The semiconductor device according to claim 1, wherein a material forming the first lead frame, the second lead frame, and the intermediate frame is the same material.

11. The semiconductor device according to claim 1, further comprising:
a first interconnect member electrically connecting the semiconductor element and an element forming a part of the interconnect circuit; and
a second interconnect member electrically connecting an element forming a part of the interconnect circuit to the second lead frame, and
the element forming the part of the interconnect circuit, the first interconnect member, and the second interconnect member are sealed in the sealing member.

12. A power converter comprising:
a main conversion circuit including the semiconductor device according to claim 1, to convert and output input power; and
a control circuit to output, to the main conversion circuit, a control signal that controls the main conversion circuit.

13. The semiconductor device according to claim 2, wherein a shortest distance between the second portion and the intermediate frame is shorter than a shortest distance between the second portion and the second lead frame.

14. The semiconductor device according to claim 2, wherein a distance, in the second direction, between the upper surface of the first portion and the upper surface of the second portion is 2 mm or more.

15. The semiconductor device according to claim 3, wherein a distance, in the second direction, between the upper surface of the first portion and the upper surface of the second portion is 2 mm or more.

16. The semiconductor device according to claim 13, wherein a distance, in the second direction, between the upper surface of the first portion and the upper surface of the second portion is 2 mm or more.

17. The semiconductor device according to claim 2, wherein the first portion is exposed from the first side surface located higher than a center, in the second direction, of the sealing member.

18. The semiconductor device according to claim 3, wherein the first portion is exposed from the first side surface located higher than a center, in the second direction, of the sealing member.

19. The semiconductor device according to claim 4, wherein the first portion is exposed from the first side surface located higher than a center, in the second direction, of the sealing member.

20. The semiconductor device according to claim 13, wherein the first portion is exposed from the first side surface located higher than a center, in the second direction, of the sealing member.

* * * * *